(12) United States Patent
Baker et al.

(10) Patent No.: US 10,455,746 B2
(45) Date of Patent: Oct. 22, 2019

(54) HYBRID COOLING SYSTEM HAVING A FREON HEAT EXCHANGER

(71) Applicant: Electronic Power Design, Inc., Houston, TX (US)

(72) Inventors: Brent Baker, Houston, TX (US); Charles Sutherland, Houston, TX (US)

(73) Assignee: Electronic Power Design, Inc., Houston, TX (US)

(*) Notice: Subject to any disclaimer, the term of this patent is extended or adjusted under 35 U.S.C. 154(b) by 0 days.

(21) Appl. No.: 15/411,996

(22) Filed: Jan. 21, 2017

(65) Prior Publication Data

US 2018/0160571 A1   Jun. 7, 2018

Related U.S. Application Data

(63) Continuation of application No. 15/097,472, filed on Apr. 13, 2016, now abandoned, and a
(Continued)

(51) Int. Cl.
*H05K 7/20* (2006.01)
*H02M 1/32* (2007.01)
(Continued)

(52) U.S. Cl.
CPC .......... *H05K 7/20945* (2013.01); *H02M 1/32* (2013.01); *H02S 40/42* (2014.12);
(Continued)

(58) Field of Classification Search
CPC .......... H05K 7/20945; H05K 7/20927; H02S 40/42; H02S 40/44; H02S 40/32;
(Continued)

(56) References Cited

U.S. PATENT DOCUMENTS 5,321,944 A * 6/1994 Bronicki ............... F01K 23/10
60/728

FOREIGN PATENT DOCUMENTS

WO    WO2011/041767 A1 *   4/2011

* cited by examiner

*Primary Examiner* — Emmanuel E Duke
(74) *Attorney, Agent, or Firm* — G. Michael Roebuck, PC

(57) ABSTRACT

A hybrid cooling system is disclosed including but not limited to an array of solar cells electrically connected to inverters for producing electricity from the sun; a chiller controller processor in data communication with the inverters and a non-transitory computer readable medium; a chiller in data communication with the chiller controller processor and in thermal communication with inverters in a sealed enclosure, wherein the inverters are cooled by an inverter coolant fluid; an array of solar cells attached to the inverters for producing power from the sun; a free cooler in data communication with the chiller controller processor and in thermal communication with the inverter cooling fluid; a Freon loop positioned a water pipe carrying the inverter cooling fluid from the invert to the chiller; and a temperature sensor apparatus in thermal communication with the inverter cooling fluid; a switch for controlling an on off state for the chiller and the cooler, where in the processor for turns the chiller on and the cooler off when the inverter cooling fluid is above a predetermined temperature. A method is disclosed for using the system.

2 Claims, 24 Drawing Sheets

Related U.S. Application Data continuation-in-part of application No. 14/616,626, filed on Feb. 6, 2015, now Pat. No. 9,927,165.

(51) Int. Cl.
 *H02S 40/42* (2014.01)
 *H02S 40/32* (2014.01)

(52) U.S. Cl.
 CPC ... *H05K 7/20927* (2013.01); *H02M 2001/327* (2013.01); *H02S 40/32* (2014.12)

(58) Field of Classification Search
 CPC .... F25B 25/005; F25B 2400/01; F25B 19/00; H02M 1/32; H02M 2001/327
 See application file for complete search history.

FIG. 6A

| TITLE: | CHILLER MODBUS ADDRESSES | | | | | |
|---|---|---|---|---|---|---|
| PROGRAM: | EPD | | | | | |
| VERSION: | 1.1 | | | | | |
| DATE: | | | | | | |
| AUTHOR: | | | | | | |
| TYPE | DESCRIPTION/VARIABLE - DISCREET | INPUT TO CONTROLLER | OUTPUT FROM CONTROLLER | R/W ACCESS | BMS INDEX | MODBUS ADDRESS |
| | AMBIENT TEMPERATURE, C | 10K NTC | | | 101 | 101 |
| | AMBIENT TEMPERATURE, DISP | | | | 102 | 102 |
| | AMBIENT TEMPERATURE, F | | | | 103 | 103 |
| | VFD OUTPUT, % | | 0-10V | | 104 | 104 |
| | COOLANT PID OUTPUT, % | | | | 105 | 105 |
| | COOLANT TEMPERATURE, C | 10K NTC | | | 106 | 106 |
| | COOLANT TEMPERATURE, DISP | | | | 107 | 107 |
| | COOLANT TEMPERATURE, F | | | | 108 | 108 |
| | DISCHARGE PRESSURE SP, PSI | OPERATOR | | | 109 | 109 |
| | DISCHARGE PRESSURE, BAR | RATIOMETRIC | | | 110 | 110 |
| | DISCHARGE PRESSURE, DISP | | | | 111 | 111 |
| | DISCHARGE PRESSURE, PSI | | | | 112 | 112 |
| | ENTERING WATER TEMPERATURE, C | 10K NTC | | | 113 | 113 |
| | ENTERING WATER TEMPERATURE, DISP | | | | 114 | 114 |
| | ENTERING WATER TEMPERATURE, F | | | | 115 | 115 |
| | HOT GAS BYPASS VALVE COMMAND, % | | STEPPER | | 116 | 116 |
| | LEAVING WATER PID OUTPUT, % | | | | 117 | 117 |
| | LEAVING WATER TEMPERATURE, C | 10K NTC | | | 118 | 118 |
| | LEAVING WATER TEMPERATURE, DISP | | | | 119 | 119 |
| | LEAVING WATER TEMPERATURE, F | | | | 120 | 120 |
| | LOADSHED PID OUTPUT, % | | | | 121 | 121 |
| | PUMP PRESSURE, BAR | RATIOMETRIC | | | 122 | 122 |
| | PUMP PRESSURE, DISP | | | | 123 | 123 |
| | PUMP PRESSURE, PSI | | | | 124 | 124 |
| | PUMP F1 FLOW RATE, DISP | | | | 125 | 125 |
| | PUMP F1 FLOW RATE, GPM | | | | 126 | 126 |
| | PUMP F1 FLOW RATE, LPM | | | | 127 | 127 |
| | FLOW RATE, DISP | RATIOMETRIC | | | 128 | 128 |
| | FLOW RATE, GPM | | | | 129 | 129 |
| | FLOW RATE, LPM | | | | 130 | 130 |
| | PUMP PRESSURE (proc), BAR | RATIOMETRIC | | | 131 | 131 |
| | PUMP PRESSURE (proc), DISP | | | | 132 | 132 |
| | PUMP PRESSURE (proc), PSI | | | | 133 | 133 |
| | PUMP PRESSURE (spindle), BAR | RATIOMETRIC | | | 134 | 134 |
| | PUMP PRESSURE (spindle), DISP | | | | 135 | 135 |
| | PUMP PRESSURE (spindle), PSI | | | | 136 | 136 |
| | SATURATED DISCHARGE TEMPERATURE, C | | | | 137 | 137 |

FIG. 6B

| TYPE | DESCRIPTION/VARIABLE - DISCREET | INPUT TO CONTROLLER | OUTPUT FROM CONTROLLER | R/W ACCESS | BMS INDEX | MODBUS ADDRESS |
|---|---|---|---|---|---|---|
| ANALOG | SATURATED DISCHARGE TEMPERATURE, DISP | - | | READ | 138 | 138 |
| | SATURATED DISCHARGE TEMPERATURE, F | | | | 139 | 139 |
| | SATURATED SUCTION TEMPERATURE, C | | | | 140 | 140 |
| | SATURATED SUCTION TEMPERATURE, DISP | - | | | 141 | 141 |
| | SATURATED SUCTION TEMPERATURE, F | | | | 142 | 142 |
| | SPINDLE PID OUTPUT, % | | 0-10V | | 143 | 143 |
| | SPINDLE TEMPERATURE, C | 10K NTC | | | 144 | 144 |
| | SPINDLE TEMPERATURE, DISP | | | | 145 | 145 |
| | SPINDLE TEMPERATURE, F | | | | 146 | 146 |
| | SPINDLE TEMPERATURE ACTIVE SP, C | - | | | 147 | 147 |
| | SPINDLE TEMPERATURE ACTIVE SP, DISP | | | | 148 | 148 |
| | SPINDLE TEMPERATURE ACTIVE SP, F | | | | 149 | 149 |
| | SUCTION PRESSURE, BAR | RATIOMETRIC | | | 150 | 150 |
| | SUCTION PRESSURE, DISP | | - | | 151 | 151 |
| | SUCTION PRESSURE, PSI | | | | 152 | 152 |
| | TCU PID OUTPUT, % | | 0-10V | | 153 | 153 |
| | TCU TEMPERATURE, C | 10K NTC | | | 154 | 154 |
| | TCU TEMPERATURE, DISP | - | | | 155 | 155 |
| | TCU TEMPERATURE, F | | | | 156 | 156 |
| | HX1 WATER ACTIVE SP, C | | | | 157 | 157 |
| | HX1 WATER ACTIVE SP, DISP | - | | | 158 | 158 |
| | HX1 WATER ACTIVE SP, F | | | | 159 | 159 |
| | HX1 FREECOOLER COMPRESSOR LOCKOUT | - | | | 160 | 160 |
| | OPTICS TEMPERATURE IN, C | RATIOMETRIC | | | 161 | 161 |
| | OPTICS TEMPERATURE IN, DISP | | - | | 162 | 162 |
| | OPTICS TEMPERATURE IN, F | | | | 163 | 163 |
| | OPTICS TEMPERATURE OUT, C | RATIOMETRIC | | | 164 | 164 |
| | OPTICS TEMPERATURE OUT, DISP | | - | | 165 | 165 |
| | OPTICS TEMPERATURE OUT, F | | | | 166 | 166 |
| | CONDENSER PID OUTPUT | - | - | | 167 | 167 |
| | PROCESS HEAT LOAD, DISP | - | | | 168 | 168 |
| | PROCESS HEAT LOAD, KW | | | | 169 | 169 |
| | PROCESS HEAT LOAD, TONS | | | | 170 | 170 |
| | PROCESS FLOW FAULT SP | OPERATOR | - | | 171 | 171 |
| | PROCESS FLOW FAULT SP, GPM | | - | | 172 | 172 |

FIG 6C

| TYPE | DESCRIPTION/VARIABLE - DISCREET | INPUT TO CONTROLLER | OUTPUT FROM CONTROLLER | R/W ACCESS | BMS INDEX | MODBUS ADDRESS |
|---|---|---|---|---|---|---|
| TYPE | DESCRIPTION/VARIABLE - ANALOG | INPUT TO CONTROLLER | OUTPUT FROM CONTROLLER | R/W ACCESS | BMS INDEX | MODBUS ADDRESS |
| DISCREET | CHILLER FAULT ALARM | | DISCREET | | 101 | 101 |
| | CHILLER WARNING ALARM | | DISCREET | | 102 | 102 |
| | COMPRESSOR 'A' RUN COMMAND | | DISCREET | | 103 | 103 |
| | COMPRESSOR 'B' RUN COMMAND | | DISCREET | | 104 | 104 |
| | COMPRESSOR SHUTDOWN (refrigeration fault) | | | | 105 | 105 |
| | CHILLER REMOTE RUN COMMAND | DISCREET | | | 106 | 106 |
| | AMBIENT TEMP OK FOR FREECOOLING | | DISCREET | | 107 | 107 |
| | FREECOOLER ENABLE COMMAND | | DISCREET | | 108 | 108 |
| | FREECOOLER EXISTS | DISCREET | | | 109 | 109 |
| | FREECOOLER FAN CONTROL ENABLED | | | | 110 | 110 |
| | FLOW SWITCH | DISCREET | | | 111 | 111 |
| | PUMP F1 RUN COMMAND | | DISCREET | | 112 | 112 |
| | PUMP (proc) RUN COMMAND | | DISCREET | | 113 | 113 |
| | PUMP (recirc) RUN COMMAND | | DISCREET | | 114 | 114 |
| | REMOTE MODE ENABLED | OPERATOR | | | 115 | 115 |
| | CHILLER ON | OPERATOR | | | 116 | 116 |
| | SYSTEM SHUTDOWN (on fault) | | | | 117 | 117 |
| | UNITS | OPERATOR | | | 118 | 118 |
| | MODBUS MASTER/SLAVE | OPERATOR | | | 119 | 119 |
| | E-STOP INPUT | OPERATOR | | READ | 120 | 120 |
| | E-STOP FAULT | OPERATOR | | | 121 | 121 |
| | OPTICS PUMP RUN COMMAND | | | | 122 | 122 |
| | OPTICS HEATER RUN COMMAND | | | | 123 | 123 |
| | FLUID COOLER FAN CONTROL MODE | | | | 124 | 124 |
| | FLUID COOLER 'PART LOAD' MODE | | | | 125 | 125 |
| | FLUID COOLER 'COLD' MODE | | | | 126 | 126 |
| | FLUID COOLER 'START' MODE | | | | 127 | 127 |
| | FLUID COOLER CONTROL VALVE POSITION FAULT | | | | 128 | 128 |
| | FLUID COOLER CONTROL VALVE FEEDBACK FAULT | | | | 129 | 129 |
| | FLUID COOLER FAN #1 O/L INPUT | DISCREET | | | 130 | 130 |
| | FLUID COOLER FAN #1 O/L FAULT | | | | 131 | 131 |
| | FLUID COOLER FAN #2 O/L INPUT | DISCREET | | | 132 | 132 |
| | FLUID COOLER FAN #2 O/L FAULT | | | | 133 | 133 |
| | FLUID COOLER FAN #3 O/L INPUT | DISCREET | | | 134 | 134 |
| | FLUID COOLER FAN #3 O/L FAULT | | | | 135 | 135 |
| | FLUID COOLER CONTROL VALVE 'MANUAL' MODE | | | | 136 | 136 |
| | FLUID COOLER TEMPERATURE FAULT | | | | 137 | 137 |
| | FLUID COOLER COMPRESSOR LOCKOUT | | | | 138 | 138 |
| | COOLANT TEMPERATURE SENSOR FAILURE | | | | 139 | 139 |
| | COOLANT HEATER ON | | | | 140 | 140 |

FIG. 6D

| TYPE | DESCRIPTION/VARIABLE - DISCREET | INPUT TO CONTROLLER | OUTPUT FROM CONTROLLER | R/W ACCESS | BMS INDEX | MODBUS ADDRESS |
|---|---|---|---|---|---|---|
| | COOLANT LOADSHED ACTIVE | | • | | 141 | 141 |
| | COOLANT CONTROL VALVE 'MANUAL' MODE | | • | | 142 | 142 |
| | COOLANT CONTROL VALVE FEEDBACK FAULT | | • | | 143 | 143 |
| | COOLANT LOW TEMPERATURE FAULT | | • | | 144 | 144 |
| | COOLANT HIGH TEMPERATURE FAULT | | • | | 145 | 145 |
| | COOLANT CONTROL VALVE POSITION FAULT | | • | | 146 | 146 |
| | PROCESS FLOW SWITCH INPUT | DISCREET | | | 147 | 147 |
| | PROCESS LOW FLOW FAULT | | • | | 148 | 148 |
| | PROCESS LOW FLOW WARNING | | • | | 149 | 149 |
| | PROCESS FLOW XDCR FAILURE | | • | | 150 | 150 |
| | EXPANSION MODULE COM FAULT | | • | | 151 | 151 |
| | EXPANSION MODULE ONLINE | | • | | 152 | 152 |
| | EXPANSION MODULE OFFLINE ALARM | | • | | 153 | 153 |
| | DESCRIPTION/VARIABLE - INTEGER | INPUT TO CONTROLLER | OUTPUT FROM CONTROLLER | R/W ACCESS | BMS INDEX | MODBUS ADDRESS |
| | COMPRESSOR 'A' RUNTIME HRS (100k/10k/1k digits) | | • | | 101 | 309 |
| | COMPRESSOR 'A' RUNTIME HRS (100/10/1 digits) | | • | | 102 | 310 |
| | COMPRESSOR 'B' RUNTIME HRS (100k/10k/1k digits) | | • | | 103 | 311 |
| | COMPRESSOR 'B' RUNTIME HRS (100/10/1 digits) | | • | | 104 | 312 |
| | PUMP (recirc) RUNTIME HRS (100k/10k/1k digits) | | • | | 105 | 313 |
| | PUMP (recirc) RUNTIME HRS (100/10/1 digits) | | • | | 106 | 314 |
| | PUMP (proc) RUNTIME HRS (100k/10k/1k digits) | | • | | 107 | 315 |
| | PUMP (proc) RUNTIME HRS (100/10/1 digits) | | • | | 108 | 316 |
| INTEGER | FREECOOLER VALVE POSITION | DISCREET OPERATOR | | READ | 109 | 317 |
| | LEAVING WATER TEMPERATURE SP, DISP | | • | | 110 | 318 |
| | LEAVING WATER TEMPERATURE SP, F | | • | | 111 | 319 |
| | - NOT USED - | | | | 112 | 320 |
| | - NOT USED - | | | | 113 | 321 |
| | - NOT USED - | | | | 114 | 322 |
| | - NOT USED - | | | | 115 | 323 |
| | MODBUS COMMAND RESULT | | • | | 116 | 324 |
| | TANK LEVEL, % | RATIOMETRIC | | | 117 | 325 |
| | MODBUS HEARTBEAT, CTS | | • | | 118 | 326 |
| | BOOLEAN STRING (addr 101-117) | | • | | 119 | 327 |
| | CONDUCTIVITY | 4-20mA | | | 120 | 328 |
| | LEAVING WATER TEMPERATURE SP, C | | • | | 121 | 329 |
| | OPTICS VALVE PID | | • | | 122 | 330 |
| | PROCESS FLOW WARNING SP, GPM | | • | | 123 | 331 |
| | PROCESS FLOW WARNING SP, DISP | | • | | 124 | 332 |
| | PROCESS FLOW WARNING SP, LPM | | • | | 125 | 333 |

_US 10,455,746 B2_

HYBRID COOLING SYSTEM HAVING A FREON HEAT EXCHANGER

CROSS REFERENCE TO RELATED APPLICATIONS

This patent application claims priority from U.S. Provisional Patent Application Ser. No. 61/936,390 filed on Feb. 6, 2014 entitled "A Hybrid Cooling System", and U.S. patent application Ser. No. 14/616,626 Entitled "A Hybrid Cooling System" filed on Feb. 6, 2015 and U.S. patent application Ser. No. 15/097,472 Entitled "A Hybrid Cooling System Having a Freon to Water Heat Exchanger" filed on Apr. 13, 2016 all three of which are hereby incorporated by reference in their entirety.

BACKGROUND OF THE INVENTION

Cooling systems for electrical power generation are part of the solution to new power generation methodologies.

FIELD OF THE INVENTION

The present invention relates to a hybrid cooling system for an electrical inverter.

SUMMARY OF THE INVENTION

In one particular embodiment, the present invention provides a hybrid cooling system for an electrical inverter. The present invention provides the hybrid cooling system that is a combination of a radiator and a chiller. The radiator cools water that is supplied to the electrical inverter during normal temperature conditions and the chiller cools the water only when the radiator is not able to cool the water tolerate the temperature. The chiller is used only during the few hours of the day during a portion of the year, i.e., midday during the summer months and rest of the time radiator is used thereby reducing the power consumption.

BRIEF DESCRIPTION OF THE DRAWINGS

FIG. 6A-6D depict an illustrative embodiment the invention showing of a list of inputs and outputs to the chiller controller processor 150 is shown;

DETAILED DESCRIPTION OF ILLUSTRATIVE EMBODIMENTS

Figure 1:
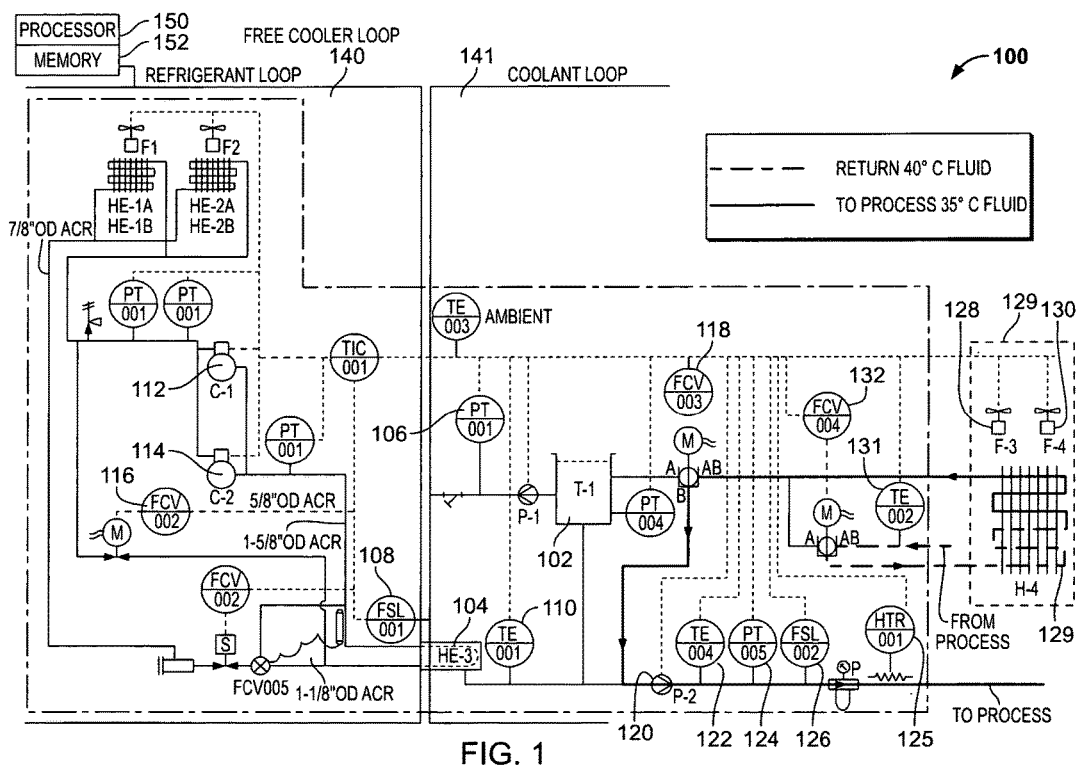
FIG. 1 depicts a plan view schematic representation of a particular embodiment of the invention comprising a hybrid cooling system.

In a particular embodiment, with a 23° F. minimum ambient, a 10-20% solution of inhibited propylene glycol (industrial grade) is provided as a cooling solution for electrical inverters. In a particular embodiment of the invention, DOWFROST™ or an equivalent is sufficient. In another embodiment of the invention, an internal heat exchanger (HX) is provided. In one embodiment, a stainless HX is provided. The stainless HX enables a designer to not have to worry about copper in the evaporator and brass, bronze etc. components in the cooling system. In another embodiment, a temperature control loop is provided with a valve and sensor, which allows the chiller to operate at a somewhat lower temperature say 70° F. (without affecting actual temp to the drive).

In another embodiment, a controller provides controls signals for a hybrid cooling system. In a particular embodiment, the controller is MODBUS capable controller processor. In another particular embodiment, the controller processor is Ethernet IP capable with a converter. Discrete IO (analog and digital) is also provided. Air inlets are provided as a filtering mechanism on the condenser air inlets for challenging installation environments. A filter test and cleaning system are provided. The inventor has determined that, no matter what kind of filter you put on a particular embodiment of the chiller, a chiller uses lots of air flow so if the environment is prone to plugging the filter. In another particular embodiment, a course of action is provided to clean the filter periodically or when a filter alarm issues.

In another particular embodiment, a multi-million dollar installation in a remote location is dependent on a chiller, thus redundant chillers are provided. Chillers move lots of air so the chiller processor determines the state of the filters with respect to plugging and/or cleaning thereof. In general, the chiller should be fairly okay with being turned on and off as the load requires. The chiller processor modulate the chiller's capacity in order to continue running at partial loads for the water cooled solar inverter. If the water cooled solar inverter is cycling to a no-load status, then the chiller compressor would cycle.

In a particular embodiment, a water to air radiator is provided to cool a water-cooled solar inverter about 90% of the time because water to air radiation is an efficient way to remove the heat from the cooling water that is added to the water while the solar inverter is producing power (also referred to herein as "the process"). The maximum cooling water temperature that the inverter can reasonably tolerate and operate is 40 Degrees C. (104 Degrees F.) and the prime location for these Solar Inverter installations is in the desert where ambient air temperatures soar. Since the operation is in the desert, the solar inverter is rated for operation up to 50 Degrees C. (122 Degrees F.). If the outside ambient temperature reaches 50 Degrees C., the radiator may very well turn into a water heater, instead of a water cooler (relative to the 40 degrees C. that an illustrative embodiment of the cooling system can comfortably tolerate). Therefore, in a particular embodiment of the invention, an active water chiller is provided to cool the water during these high ambient temperatures. The problem is that active water chillers such as refrigeration circuits are not energy efficient, thus unless used judiciously and sparingly, use too much energy, thereby reducing the effectivity of the process that is there to produce energy. Also, we don't want to simply shut down the process during these high ambient temperature conditions because these will typically occur when the sun is the brightest and hottest and the process can produce the most power from the farm of solar panels connected to the energy inverters. Thus, using an embodiment of the present invention provides a hybrid cooling system, where the hybrid cooling system uses the active chiller (refrigeration circuit discussed below) during the few hours of the day during the year (midday during the summer months) when the heat soars and uses the simple water to air heat exchanging radiator the rest of the time.

Turning now to FIG. 1, an illustrative embodiment 100 of the present invention is depicted schematically in FIG. 1. The purpose of this system is to provide cooling to some liquid cooled solar inverter drives (the process) and associated electrical components such as chokes. In a particular embodiment, the process coolant fluid is a propylene glycol solution and the desire is to maintain a supply temperature of 35° C. (95° F.)±2° C. in an energy efficient manner during ambient conditions that range from 23° F. to 122° F. The hybrid cooling system concept for a particular illustrative embodiment of the invention is illustrated in FIG. 1. In a particular embodiment as illustrated in FIG. 1, the hybrid solar inverter cooling system includes but is not limited to an air cooled chiller (refrigeration circuit) and a free-cooler 129 (water to air radiator). The free cooler (water-to-air radiator) is used during the majority of the year to reject process heat generated by the liquid cooled solar inverters directly to the ambient air and the chiller is designed to reject heat generated by the process through a refrigeration circuit to the ambient air when the ambient temperature is above a temperature that will allow the desired coolant supply temp to be maintained with the cooler. The hybrid cooling system provides a chiller processor that runs both the chiller and the cooler and determine when each should be running The hybrid cooling system provides for chiller processor communications using a communications protocol (MODBUS) and with discrete and analog signals.

An illustrative embodiment of the hybrid chilled coolant circuit is depicted schematically in FIG. 1. An illustrative embodiment of the free cooler loop is schematically depicted in FIG. 1. As shown in FIG. 1, a refrigeration loop 140 and a coolant loop 141 are provided in an illustrative embodiment. Warm coolant (water and glycol mixture) returns from the process and goes into the reservoir tank (T-1) 102. The tank is constructed of stainless steel and has a closed top (vented to atmosphere) to limit ingress of contaminants. The coolant is then pumped through a strainer to remove large-scale contaminants that might plug the evaporator and the travels on to a brazed plate evaporator (HE-3) 104 where it is cooled. A brazed plate evaporator is provided that has alternating plates of copper and stainless steel that are brazed in a high temperature furnace. The evaporator provides four connections, 2 for water and 2 for refrigerant. The water and refrigerant pass on to opposite sides of the plates to exchange heat.

A pump discharge pressure transducer (PT003) 106 provides feedback on discharge pressure which can be used in comparison with a pump curve for the system pump P-1, to estimate flow. A flow switch (FSL001) 108 ensures that sufficient flow is being provided to the evaporator. After the evaporator, a temperature sensor (TE001) 110 is provided that is used to monitor and control the temperature in the desired range by cycling the compressors (C-1 112, C-2 114) and actuating the modulating hot gas bypass valve (FCV-001) 116 to control the temperature. (See the refrigeration circuit discuss below for more details.) The cooled coolant fluid flows either back into the reservoir or alternately into the process pump (P-2) suction as dictated by the position of the 3-way process tempering valve (FCV003) 118. If the chiller is running, the chiller processor controller 150 attached and data communication (exchanging data back and forth with) with non-transitory computer readable medium 152, executes a computer program stored in the computer readable medium to determine that cooling is required to the coolant process circuit, the valve 3-way process tempering valve is actuated by the chiller processor controller to divert a portion of returning water back to the reservoir, T-1, thereby bringing cooler water into the process pump P-2 120.

The process water circuit maintains the temperature of the coolant fluid supplied to the drives at 35° C. (95° F.)±2° C. At temperatures up to 90° F., the free cooler can accomplish this. Above 90° F., however, the chiller processor at least partially switches off the free cooler circuit and at least partially switches on the chiller circuit to supply cooled water to achieve the cooling of the fluid supply to the drives. The process pump (P-2) 120 pushes the process coolant, glycol solution past the process temperature supply sensor (TE004) 122, pressure transducer (PT005) 124, flow switch (FSL002) 126, full flow 100 micron filter assembly and through a heater (HTR001) 125 before going out to the process to cool the inverters and associated electronics. The value from the temperature sensor is used by the chiller processor to actuate the 3-way process tempering valve (FCV003) 118 when the chiller is on. The chiller processor controller controls and utilized this same value to control the cooler fans (F-3 128 and F-4 130) and the position of the 3-way free-cooling modulating valve (FCV004) 132 when the free-cooler (HE-4) 129 is operating. The chiller processor uses the pressure transducer for informational purposes and the flow switch to insure that a minimum process flow is being met. The heater provides the ability to raise the loop temperature (in case of lower temperature startup) and the full flow filters provide protection against contaminants going to the drives.

The fluid coolant returns from cooling the process inverters and associated electronics, where the chiller processor controller sense the return temperature (TE002) 131 which is also used in control of the free cooling modulating valve (FCV004) 132. The free cooling modulating valve 132 is manipulated by the chiller processor controller 150 to determine how much flow goes to the free cooler 129 and how much bypasses the cooler.

In chiller only mode, the free cooling modulating valve completely diverts the water back to the return line bypassing the free cooler 129. In free-cooling mode, the free cooling modulating valve modulates so as much water as is needed to maintain the process temperature flows to the cooler. In an illustrative embodiment, the free cooler 129 is a large water-to-air heat exchanger with copper coils and aluminum fins. The chiller processor controls circulates the coolant fluid through the free cooler copper coils and draws air across the free cooler coils to remove the heat from the fluid. In a particular embodiment, the free cooler is selected to provide a cooling capacity to cool 64 gallons per minute (GPM) (240 liters per minute (LPM)) flow to 95° F. with 90° F. ambient air while removing 40 kW of heat.

In a particular embodiment, in a free cooling mode, the chiller processor positions the 3-way tempering valve (FCV003) 118 to fully divert the returning water from the process cooling, back to the process pump suction (P-2) 120, which helps to keep the reservoir of water in tank T-1 at a lower temperature, facilitating a chiller startup process during which the tank will pull down prior to switching over from using free cooler for cooling to using the chiller for cooling the process coolant.

Figure 2:
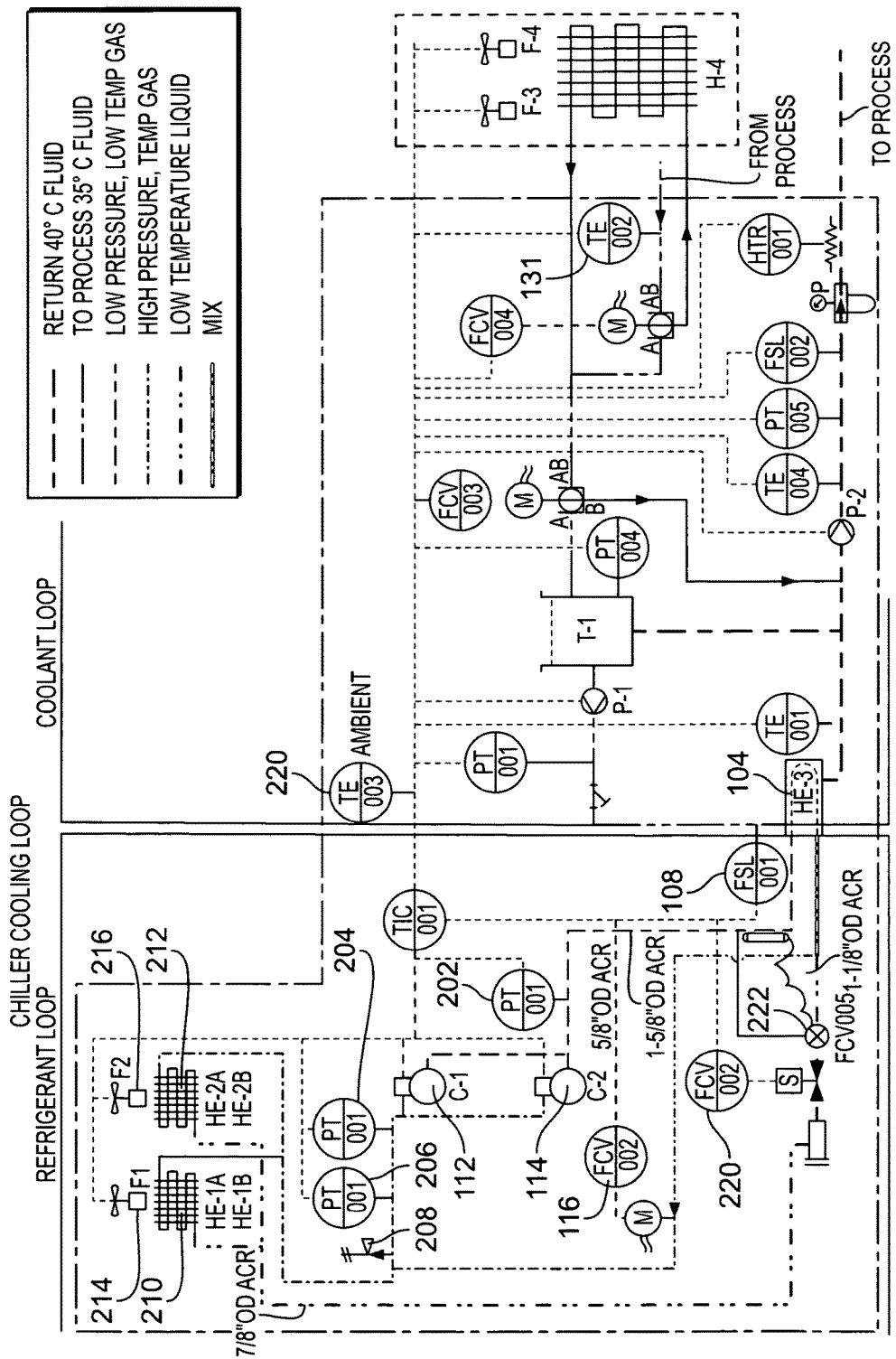
FIG. 2 depicts a plan view schematic representation of another particular embodiment of the invention comprising a hybrid cooling system.

Turning now to FIG. 2, the chiller cooling loop is schematically depicted. In an illustrative embodiment a refrigeration circuit (also referred to herein as the refrigeration loop) 140 is provided. The refrigeration circuit utilizes R410A refrigerant which is recognized as one of the best performing refrigerants for the process based on efficiency and GWP (global warming potential). R410A is the dominant refrigerant globally and particularly in the western hemisphere. All-aluminum micro-channel condensers are provided in an illustrative embodiment. The refrigeration loop cycle starts with low pressure, low temperature gas going into the two compressors (C-1, C-2) where the gas is compressed to a high pressure, high temperature gas. The chiller controller processor uses pressure transducer (PT001) 202 to sense and monitor the refrigerant suction pressure as a safety to monitor against low pressure. The chiller controller processor uses another transducer (PT002) 204 to sense and monitor discharge pressure and protect against over-pressure. A mechanical high pressure switch (PSH001) 206 is provided as pressure relief and acts as a redundant safety and a relief valve (PSV001) 208 is provided to act as a final safety.

In an illustrative embodiment, the chiller processor controller directs the high pressure, temperature gas either to micro-channel condensers HE-1A, 1B 210 and HE-2A, 2B 212 where the gas passes through small micro-channels to which aluminum fins are attached or directly back to the inlet of the evaporator (HE-3) 104 through the modulating hot gas bypass valve (FCV001) 218 bypassing the condensers (discussed further below). For the gas directed into the condensers HE-1A, 1B 210 and HE-2A, 2B 212, the two fans, F-1 214 and F-2 216 draw air through the condenser coils which results in heat being transferred from the refrigerant to the ambient air surrounding the refrigeration circuit. As the refrigerant cools, it condenses forming a liquid which passes out of the condensers into a copper refrigerant line before proceeding to the filter/drier which removes any contaminants or moisture from the refrigerant. The refrigeration circuit fans speed is controlled by the chiller controller processor via an ABB VFD to maintain condensing pressure particularly in lower ambient temperature conditions. The condenser selection is selected to provide the total heat exchange required by the process up to 122° F. ambient while also maintaining proper operating conditions down to the minimum temperature of 23° F.

In an illustrative embodiment, the liquid refrigerant proceeds past the liquid line solenoid valve (FCV002) 220 which is provided to prevent refrigerant migration when the chiller is turned off, and is metered into the evaporator (HE-3) 104 by the thermostatic expansion valve (FCV005) 222. This valve is designed to meter liquid refrigerant into the evaporator at a rate designed to ensure that all the liquid refrigerant evaporates prior to leaving the evaporator. The liquid refrigerant mixes with any hot gas that has been directed around the condenser and proceeds into the evaporator where it changes state to a low temperature gas thereby absorbing the heat from the water through the walls of the evaporator. The hot gas bypass valve (FCV001) 218 is provided to maintain load and temperature control without cycling the compressors off during lower loads and fans which will maintain better control than a cycling system that cycles on and off with less wear and tear on those components. In cases where the load is below 50%, the chiller controller processor cycles off one of the two compressors thus reducing total energy usage. The two compressors automatically lead/lag to keep even running time. The low pressure gas exits the evaporator to begin the refrigeration cycle again.

The chiller processor controller provides control of switchover between chiller and free cooler predicated on the ambient temperature sensor (TE0003) 220 and actual process temperatures. The chiller processor performs switchover to the chiller will commences when the ambient exceeds 90° F. and the process temperature exceeds 95° F. The chiller processor performs switchover back to the cooler would occur when the ambient drops below 88° F.

The chiller controller processor on the chiller collects significant amounts of data including fluid temperatures, fluid pressures, refrigerant pressures, motor status and the ambient temperature of the air surrounding the hybrid cooling system. The chiller controller processor then uses this data in a variety of routines. The initial chillers include MODBUS RTU via RS485. The chiller controller processor monitors active alarms as they occur. MODBUS is also provided via an internet protocol Ethernet. In an illustrative embodiment, the chiller processor converts the MODBUS to PROFIBUS. In another illustrative embodiment, individual discrete/analog signals are provided.

Figure 3:
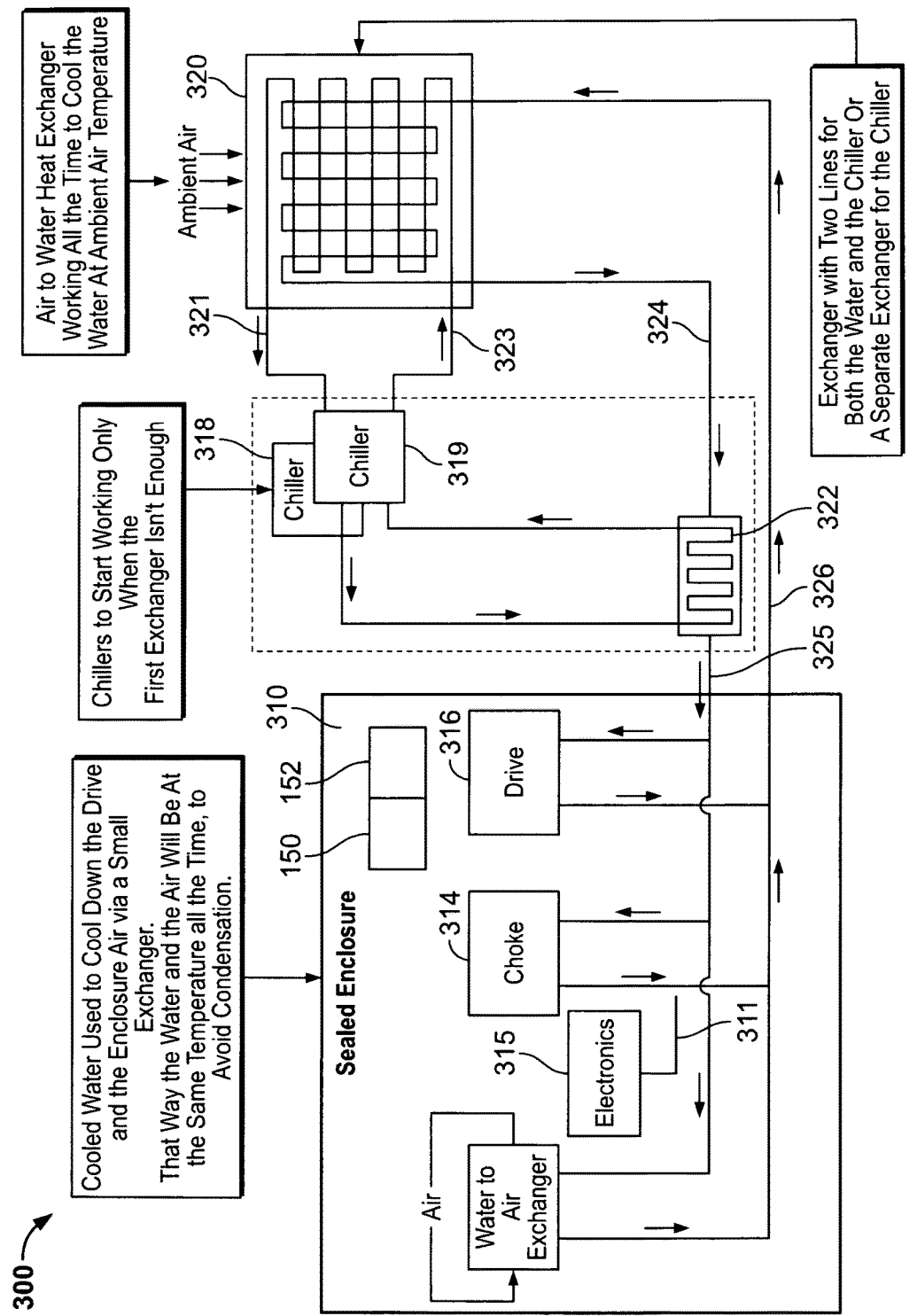
FIG. 3 depicts a plan view schematic representation of another particular embodiment of the invention comprising a hybrid cooling system.

Turning now to FIG. 3, an illustrative embodiment of the invention 300 is depicted in schematic form. As shown in FIG. 3 an air to water heat exchanger 320 runs continuously to cool the water at ambient air temperature. In a particular illustrative embodiment, the air to water heat exchanger 320 is provided with two lines 324 and 326 for the water to air heat exchanger and two lines 321 and 323 for the chiller 319. In another illustrative embodiment, a separate heat exchanger for the chiller is provided. As shown in FIG. 3, cooled water is used to cool down the drive 316 and the enclosure 310 via a small water to air heat exchanger 312. In a particular embodiment, the small heat exchanger 312 is provided and controlled by the chiller processor controller to maintain the air 330 inside the sealed enclosure and the water flowing through heat exchanger 312 to avoid condensation inside the sealed enclosure. Condensation can drip on the drive 316, choke 314 and associated electronics 315 inside the sealed enclosure 310. A pair of chillers 318 and 319 are provided in a particular illustrative embodiment of the invention. The chiller controller process cycles on the chillers when the heat exchanger 320 is insufficient to cool the drive 316 to below maximum operating temperature. In a particular embodiment, a water leak sensor 311 is provided inside the sealed enclosure 310. In a particular embodiment, the water leak sensor is insulated wire that provides a short circuit when exposed to water. The water penetrates a water penetrable insulation on the wire and provides a short circuit. The short circuit is sensed by the chiller controller processor 150. The chiller controller processor can then shut down the drive 316, choke 314 and associated electronics 315 when water is detected inside the sealed enclosure to prevent short circuiting of the driver, choke and associated electronics.

Figure 4:
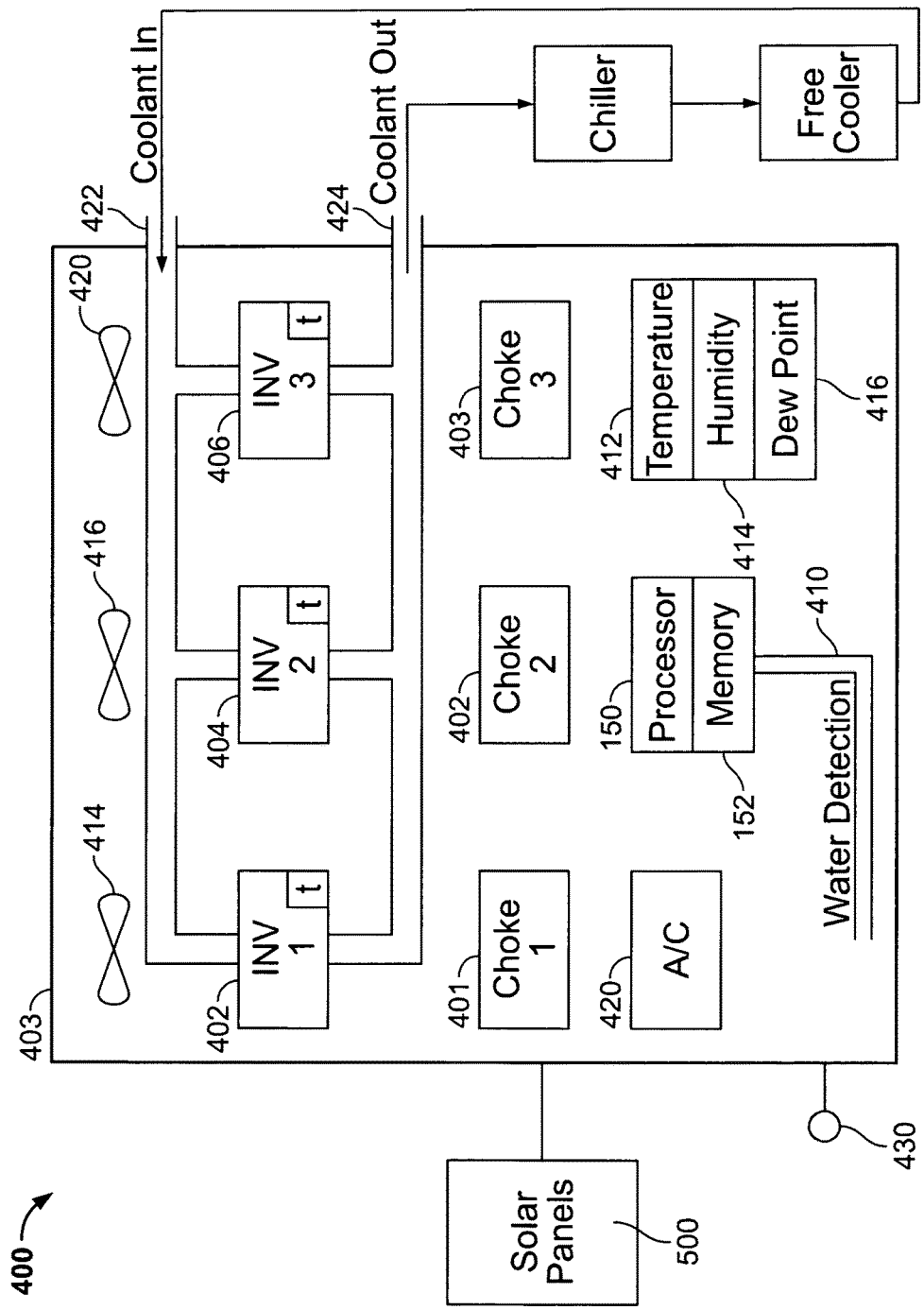
FIG. 4 depicts a plan view schematic representation of another particular embodiment of the invention comprising a hybrid cooling system.

Turning now to FIG. 4, in a particular illustrative embodiment 400 of a sealed enclosure 403 is depicted. As shown in FIG. 4, each sealed enclosure contains a chiller controller processor 150, a non-transitory computer readable medium 152. Each enclosure 403 further contains three inverters 402, 404 and 406 and three chokes 401, 403 and 405. Each inverter and choke is temperature controlled by coolant flowing selectively through the chiller refrigeration circuit and the free cooler. A temperature sensor "t" 411 is provided to sense the temperature on individually on each inverter/choke combination 1, 2, and 3 and sealed enclosure temperature sensor 412 to sense the cabinet temperature. A humidity sensor 414 and dew point sensor 416 are provided to determine the humidity and dew point inside the sealed enclosure 403. An air conditioner 420 is provided in the sealed enclosure to heat or cool the air inside of the sealed enclosure. A water detector 410 is provided to detect water inside of the sealed enclosure. Three inverter fans 414, 416 and 420 are provided to help cool the inventors and chokes inside the sealed enclosure. The processor monitors the sealed enclosure temperature, the humidity level and the dew point to determine if there is risk of the coolant 422 flowing into the sealed chamber and the coolant flowing out of the sealed enclosure reach a temperature that may cause condensation of water in the air inside the sealed enclosure. If the processor determines that the temperature air is too cool and may allow condensation, the air is warmed by the AC 420. If the processor determines that the temperature air is too warm and may beat up the cabinet and inverters, the air is cooled by the AC 420. Solar panels 505 are electrically connected to the inverters in groups 500. The inverters are provided with a current limiting control so that the inverters can be de-rated from 100% capacity when the processor determines that it is desirable to do so.

Figure 5:
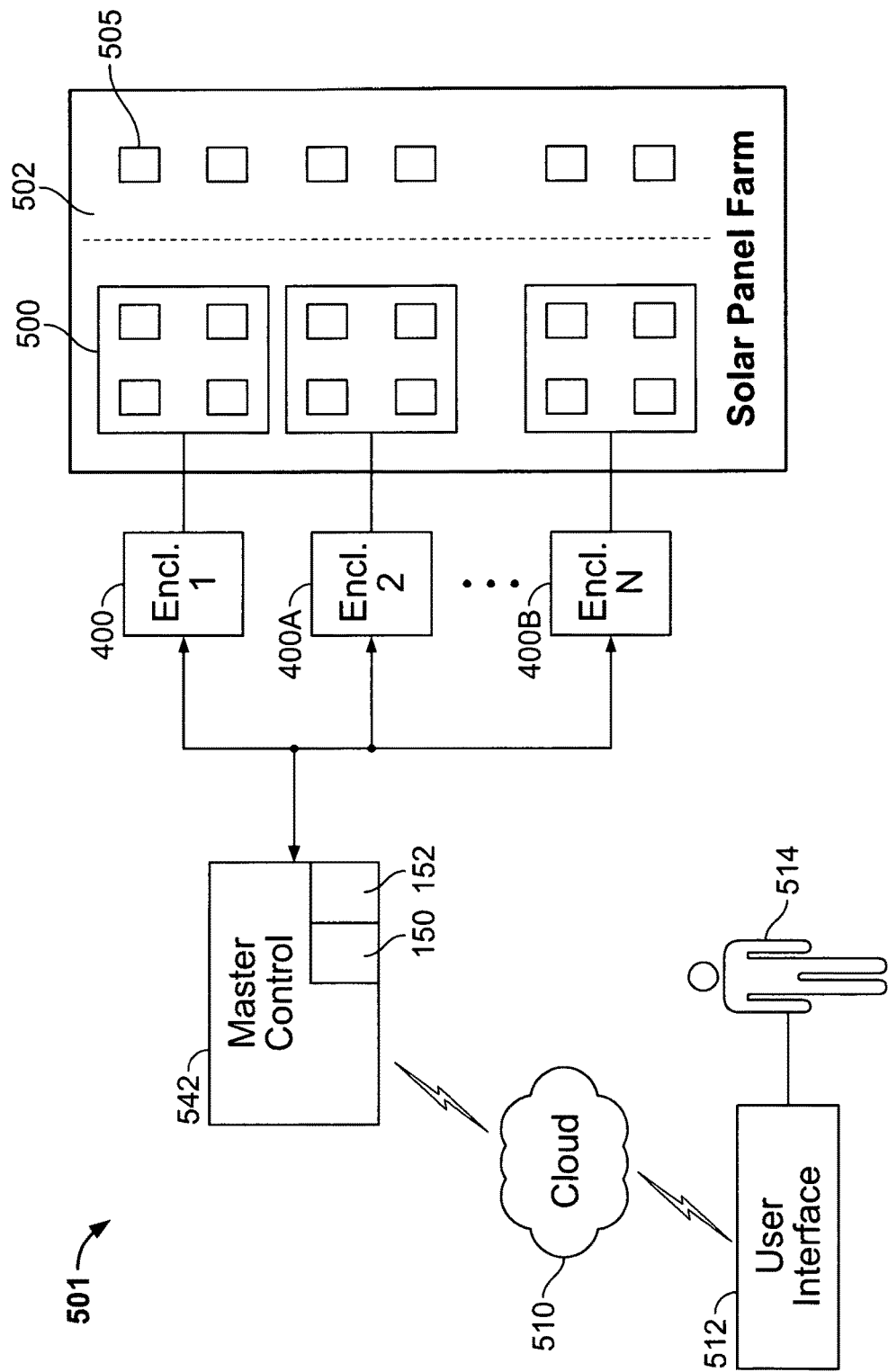
FIG. 5 depicts a plan view schematic representation of another particular embodiment of the invention comprising a hybrid cooling system.

Turning now to FIG. 5, in another particular embodiment, the enclosure 400 one of many enclosures connected to a solar panel farm 502 and in data communication (exchanging data back and forth) with a master controller 542. The master controller is connected to a cloud computing application, such as the internet which is in data communication with a user interface 512. Using the user interface and the master controller a user 514 can control the many enclosure to electronically de-rate individual inverters by sending current limiting commands to each controller for each inverter in a particular sealed enclosure.

In another particular embodiment the master controller includes a processor 150 and non-transitory memory 152. The processor memory 152 includes but is not limited to a neural network containing historical data about the energy efficiency of the enclosures and the solar panel farm. In another embodiment each enclosure processor includes but is not limited to a neural network for containing historical data about the energy efficiency of the enclosures and the portion 500 of the solar panel farm to which it is connected.

The neural network monitors and senses all inputs and outputs, all electrical components and sensors in each enclosure, water and coolant flow pressures and temperatures for the free cooler and chiller and makes decisions as to controlling the components to achieve a desired efficiency in net energy production based on these inputs and outputs.

Figure 7:
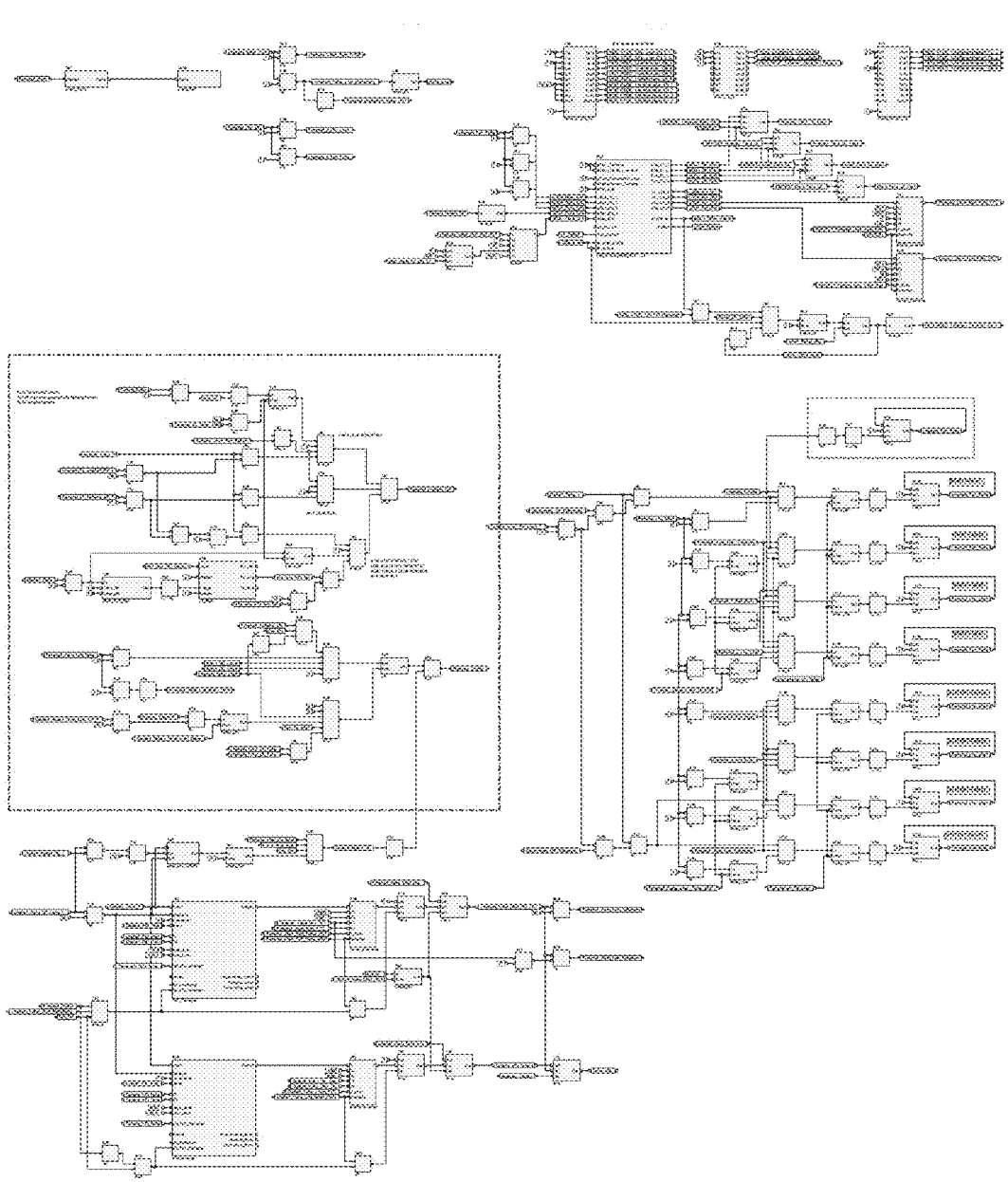
FIG. 7 depicts plan view a fluid controller scheme for a particular illustrative embodiment of the invention is depicted.
Figure 8:
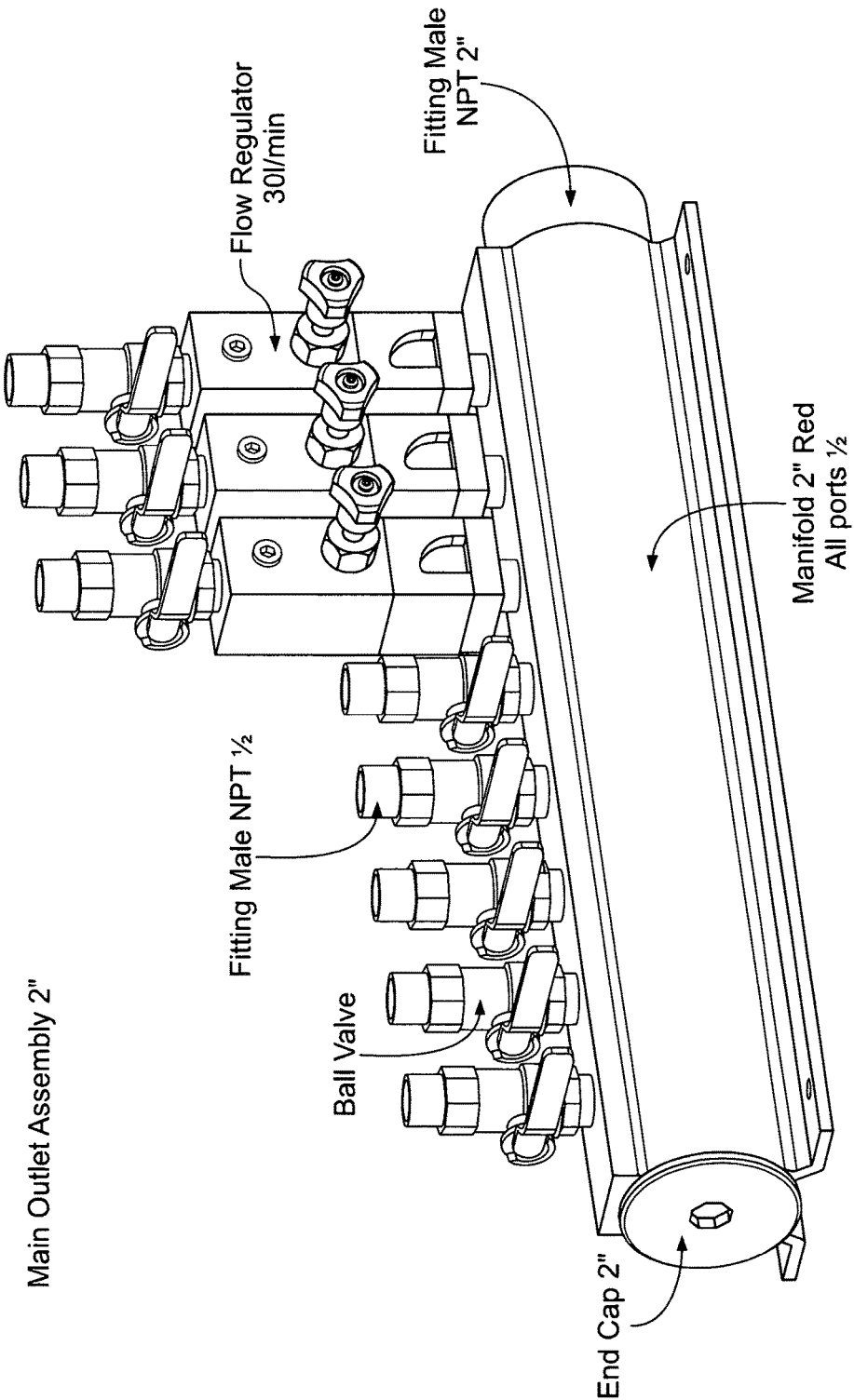
FIG. 8 is a plan view that depicts a particular embodiment of the invention of a a manifold assembly scheme is depicted.
Figure 9:
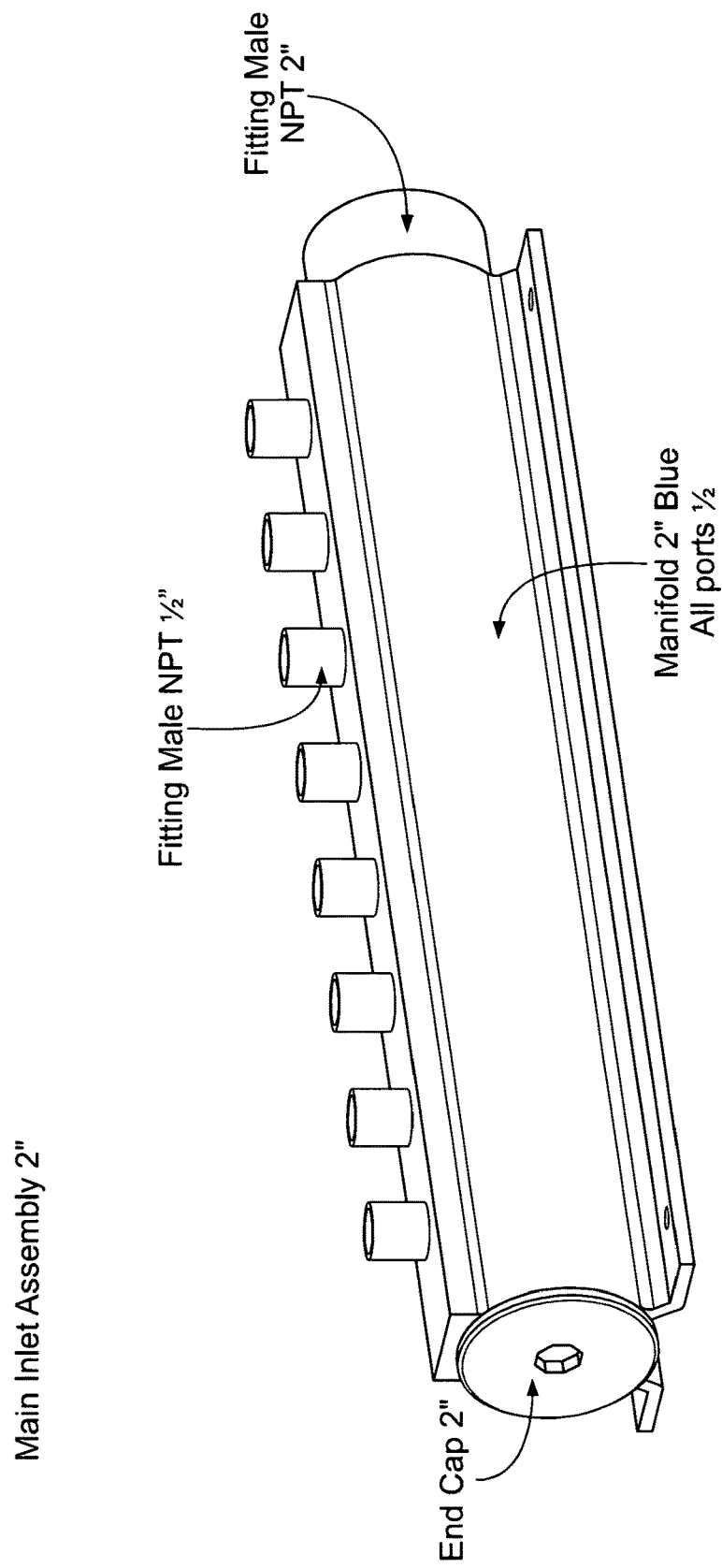
FIGS. 9-9D, 10 and 11 are plan views that depict a particular embodiment of the invention of a a manifold assembly scheme is depicted.
Figure 9A:
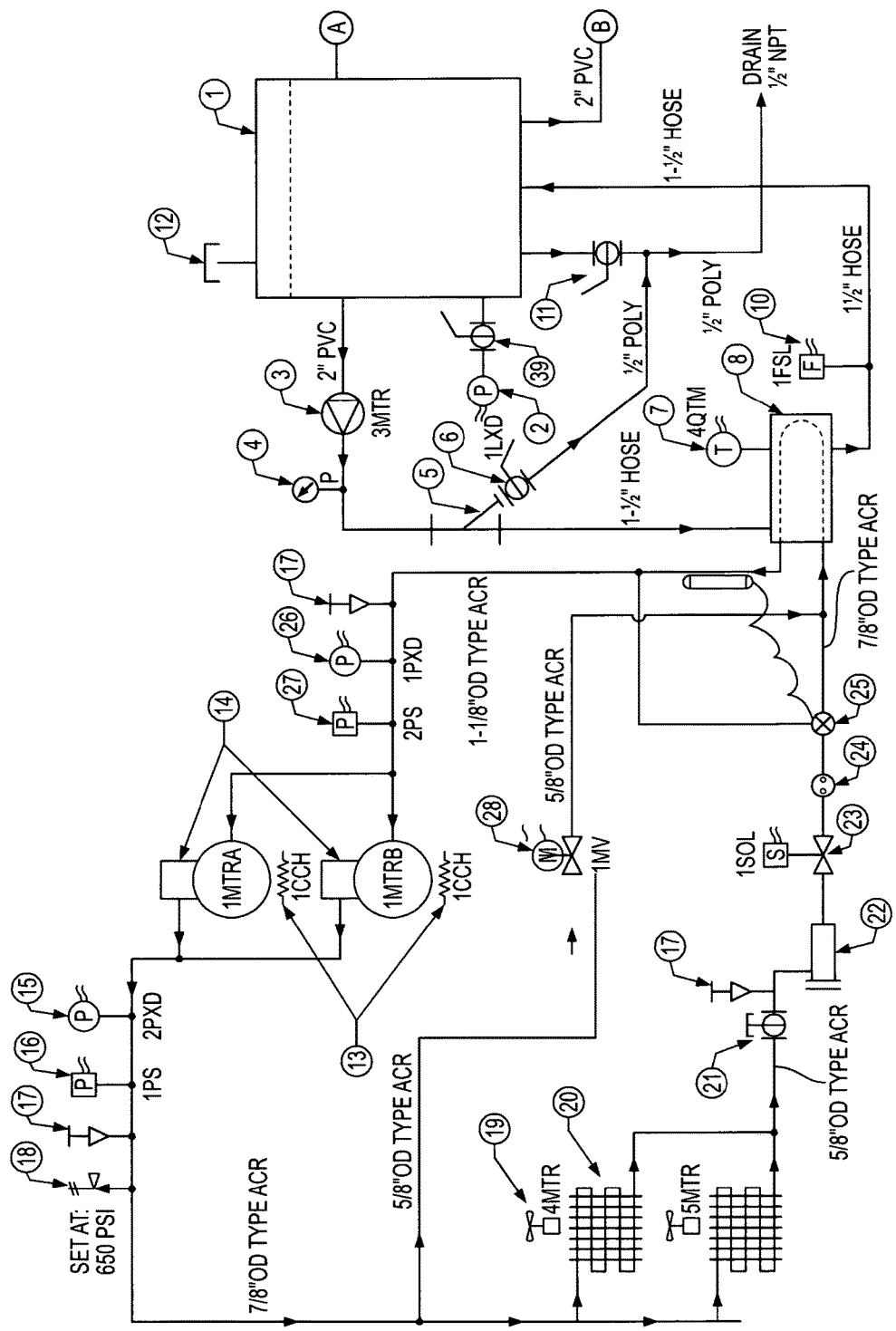
Figure 9B:
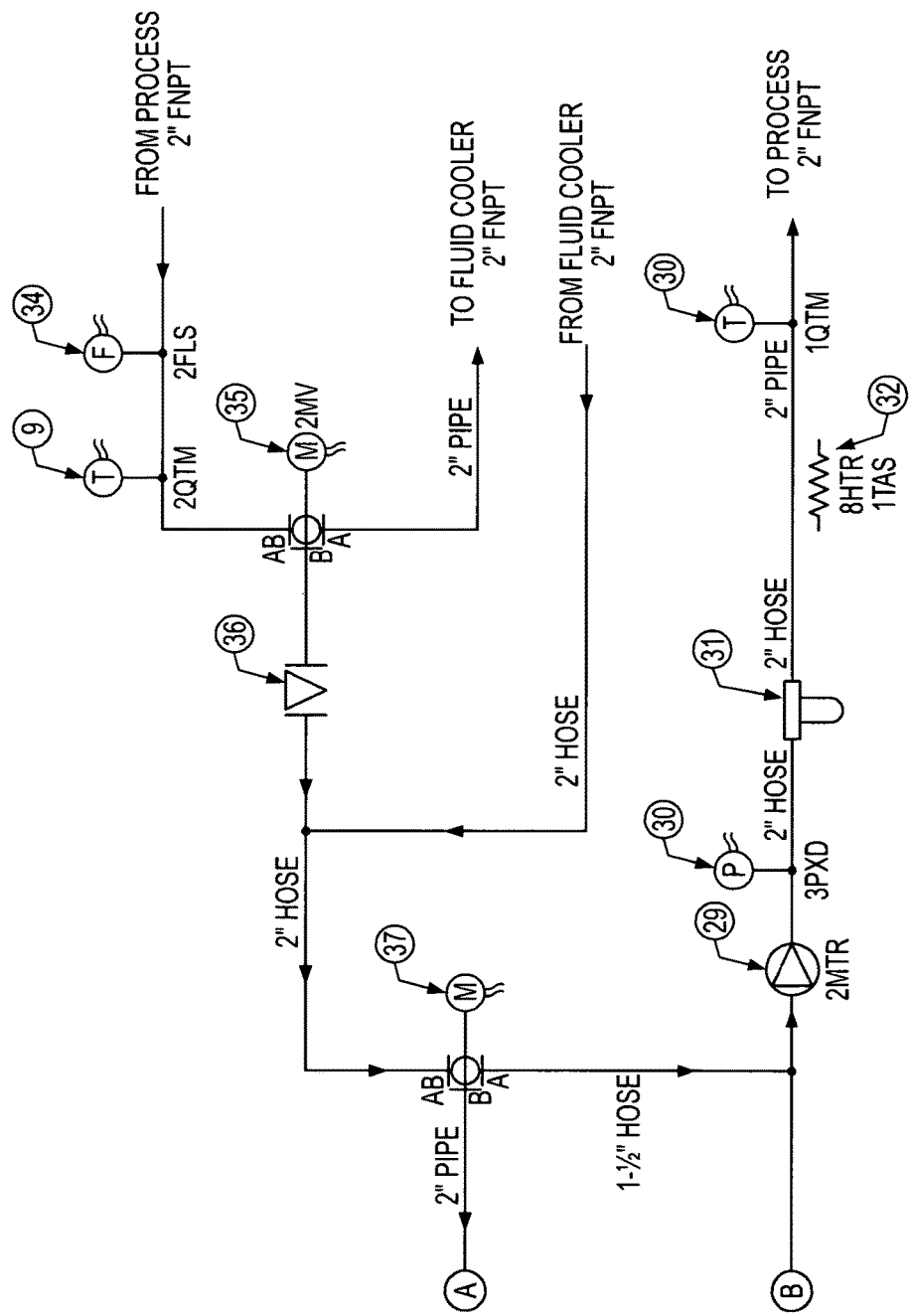
Figure 9C:
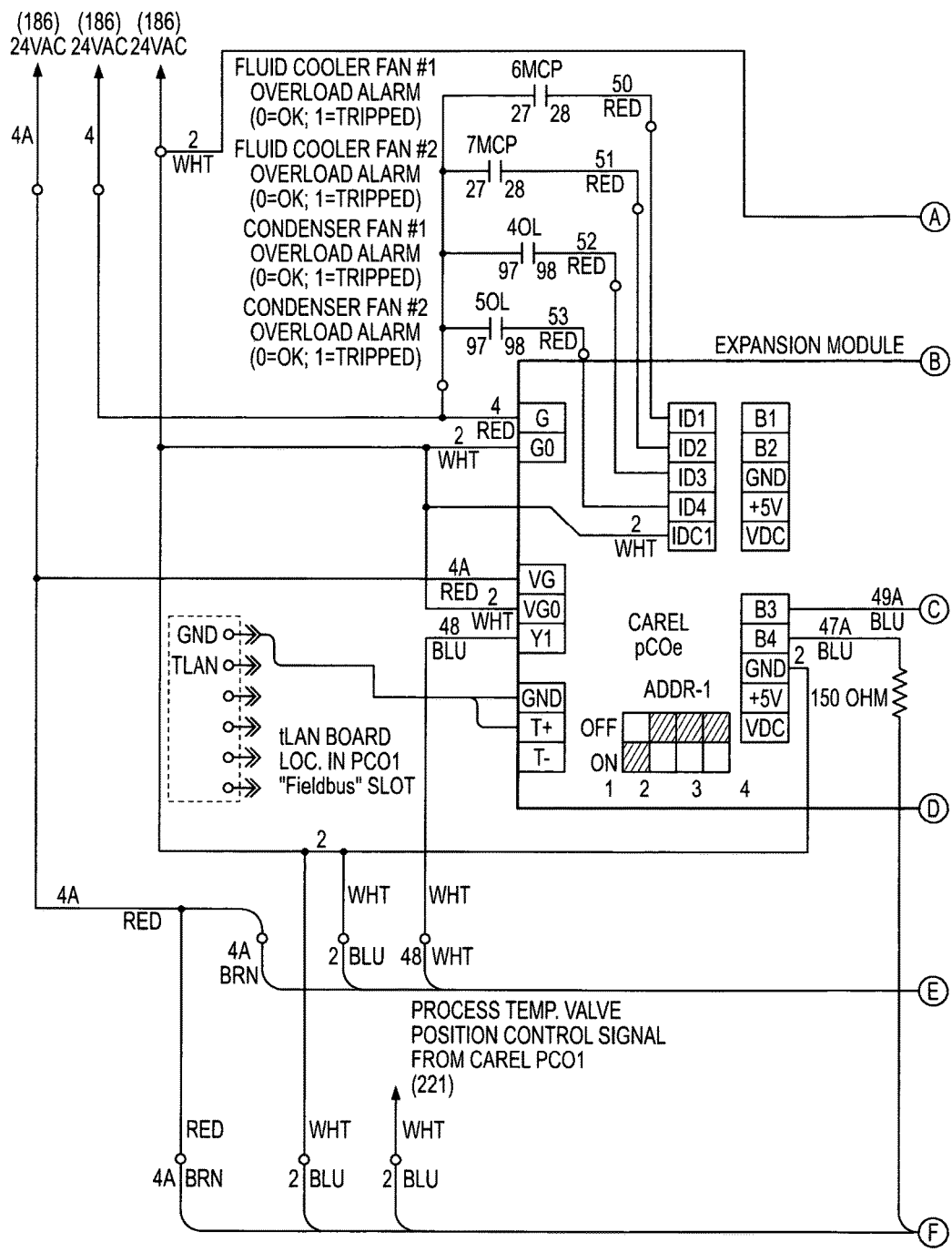
Figure 9D:
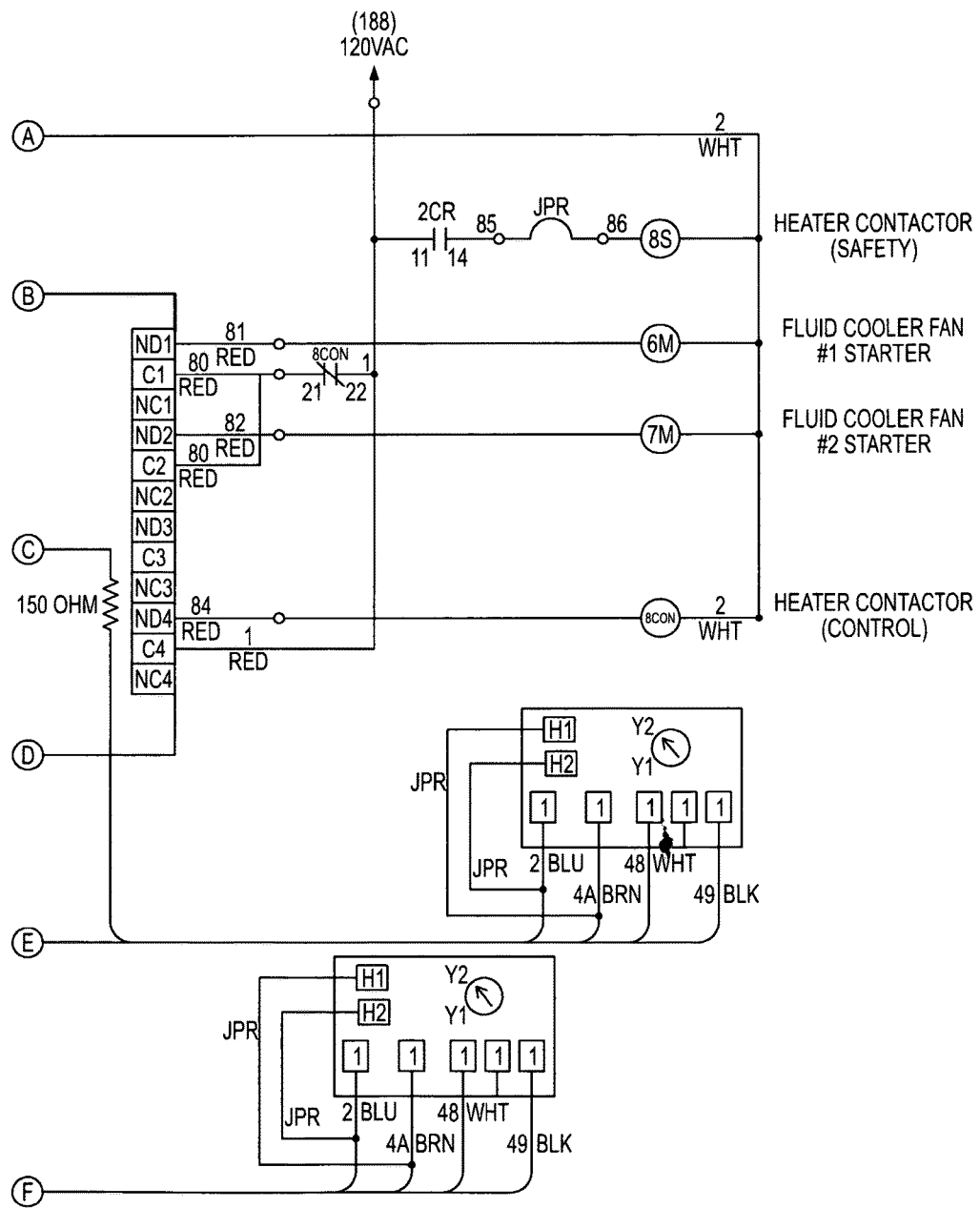
Figure 10:
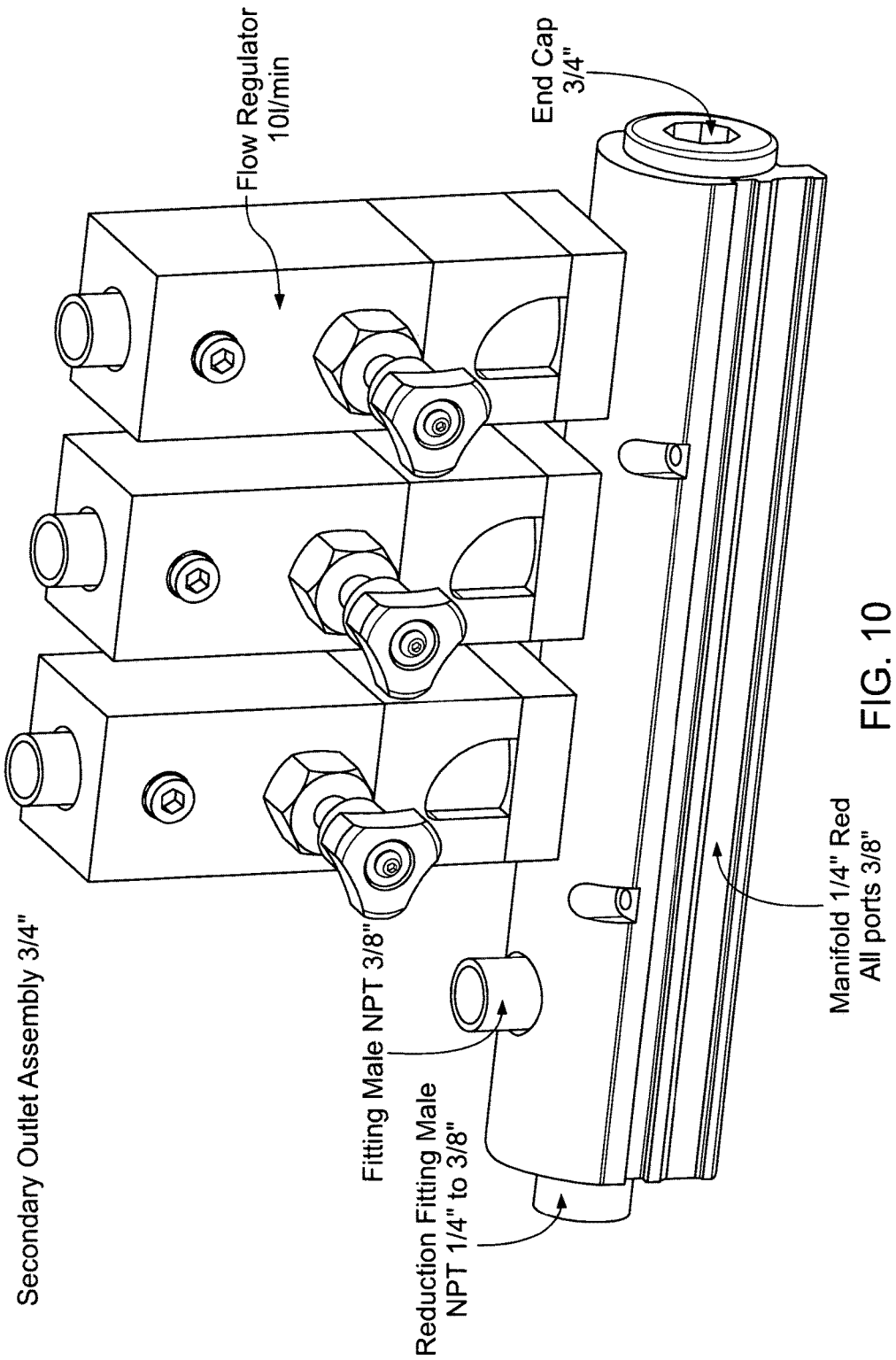
Figure 11:
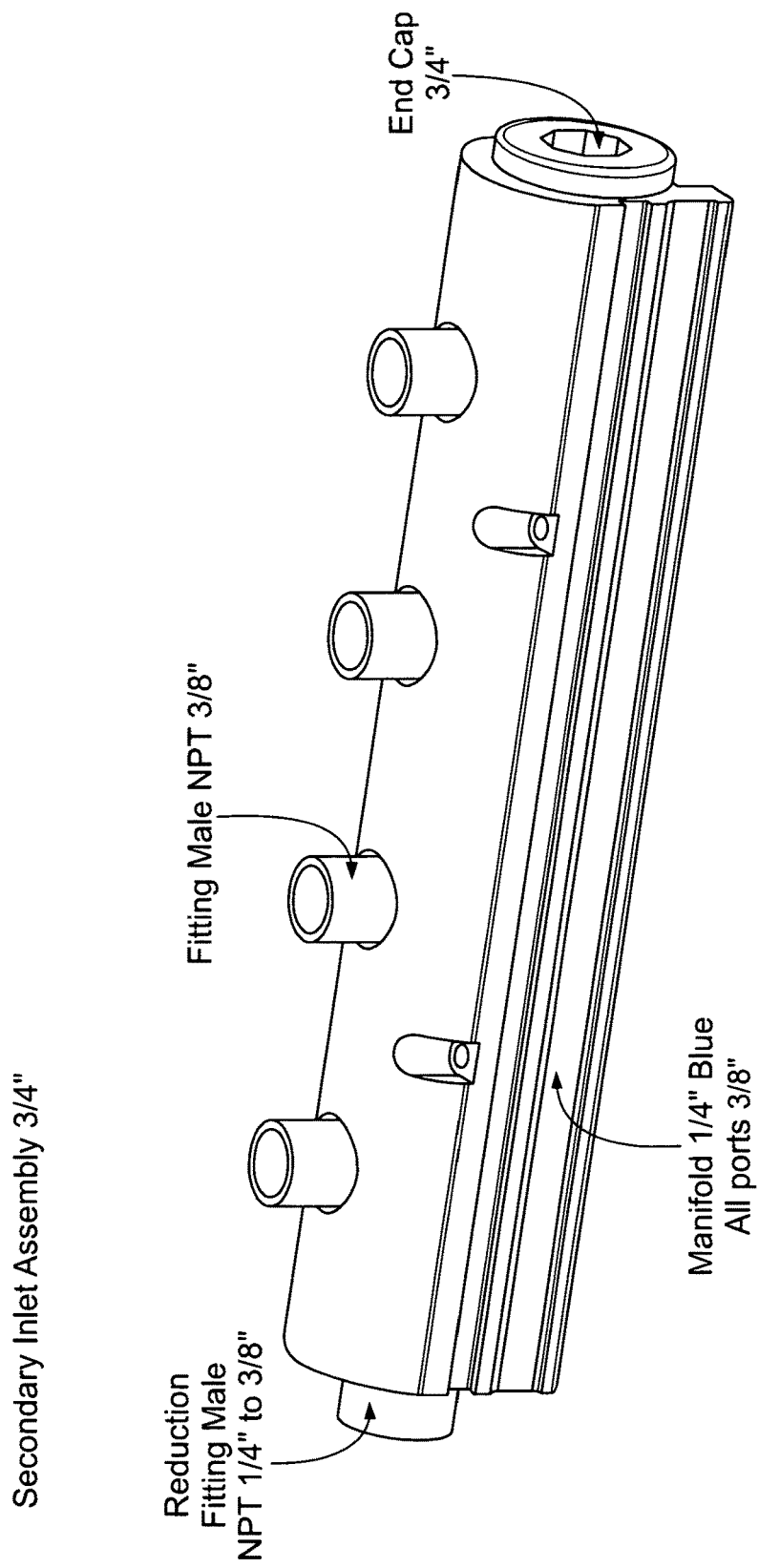
Figure 12A:
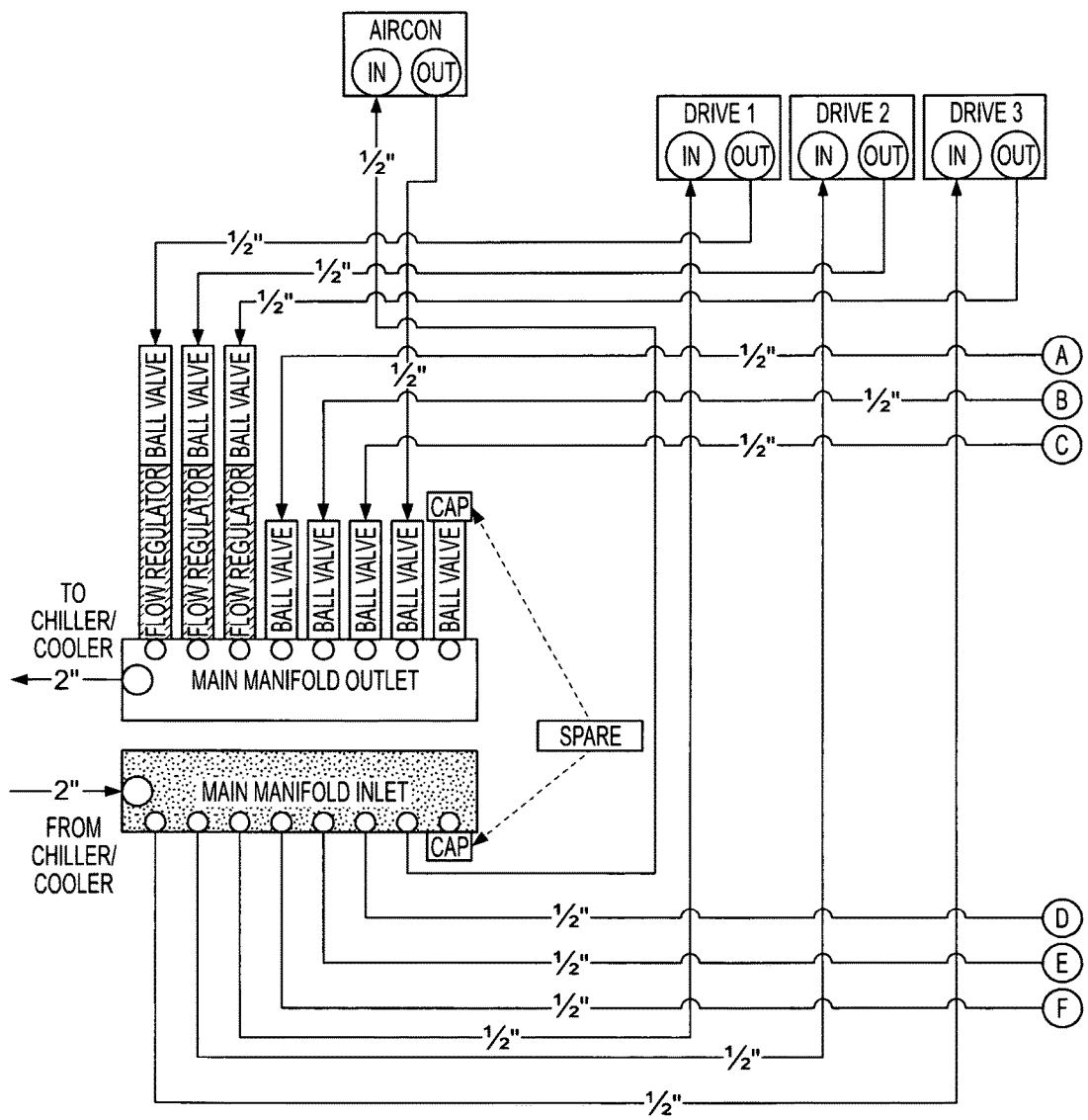
FIG. 12A and 12B are plan views that depict a water cooling plan view diagram for a drive section in a particular embodiment of the invention is depicted.
Figure 12B:
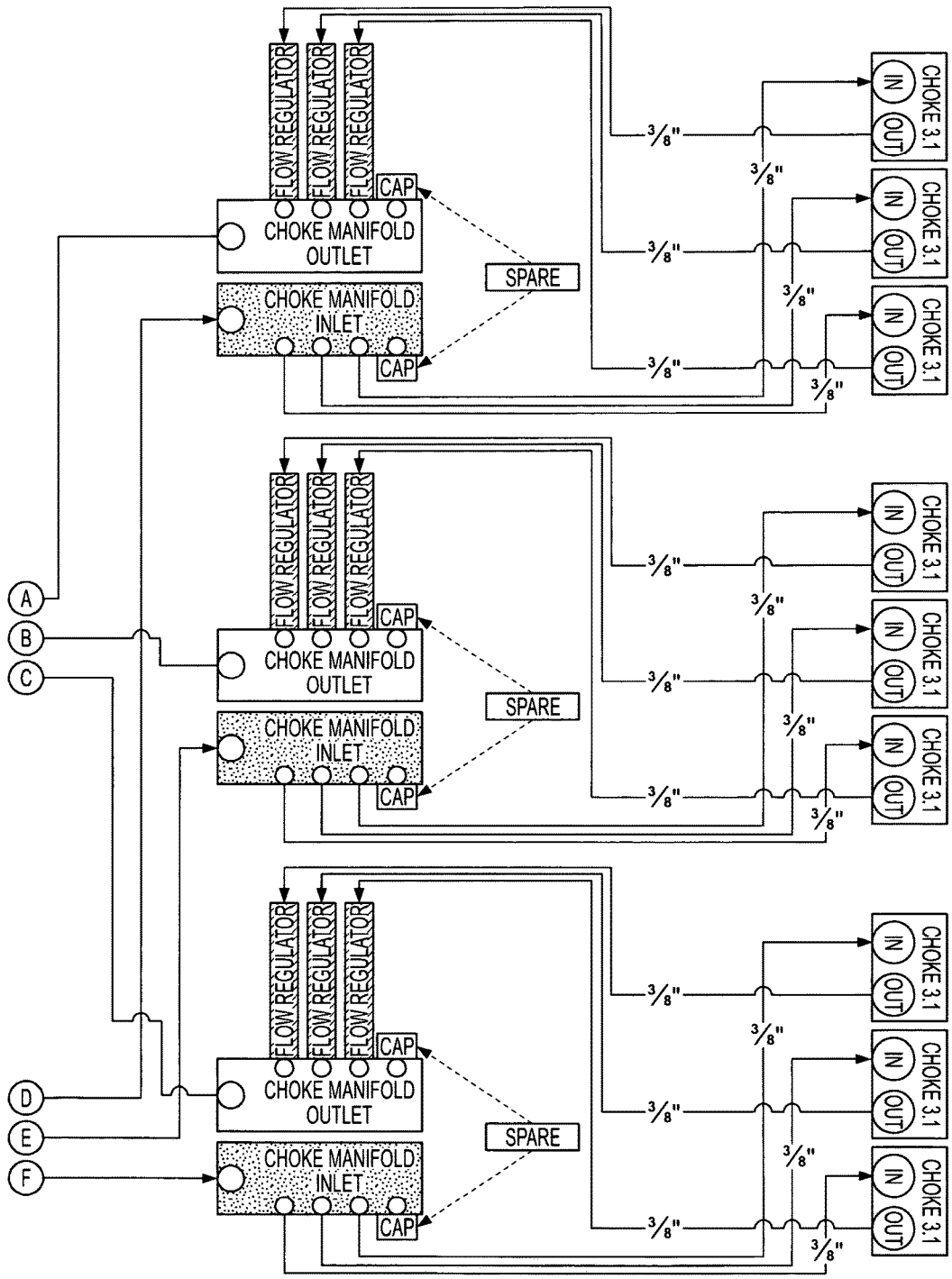

Turning now to FIG. 6A-6D, an illustrative embodiment the invention showing of a list of inputs and outputs to the chiller controller processor 150 is shown. Turning now to FIG. 7, a fluid controller scheme for a particular illustrative embodiment of the invention is depicted. Turing now to FIG. 8-11, a particular embodiment of the invention of a manifold assembly scheme is depicted. Turning now to FIG. 12, a water cooling diagram for a drive section in a particular embodiment of the invention is depicted. In a particular illustrative embodiment, the processor 150 is in data communication with all of the electrical components inside of the sealed enclosure.

Figure 13:
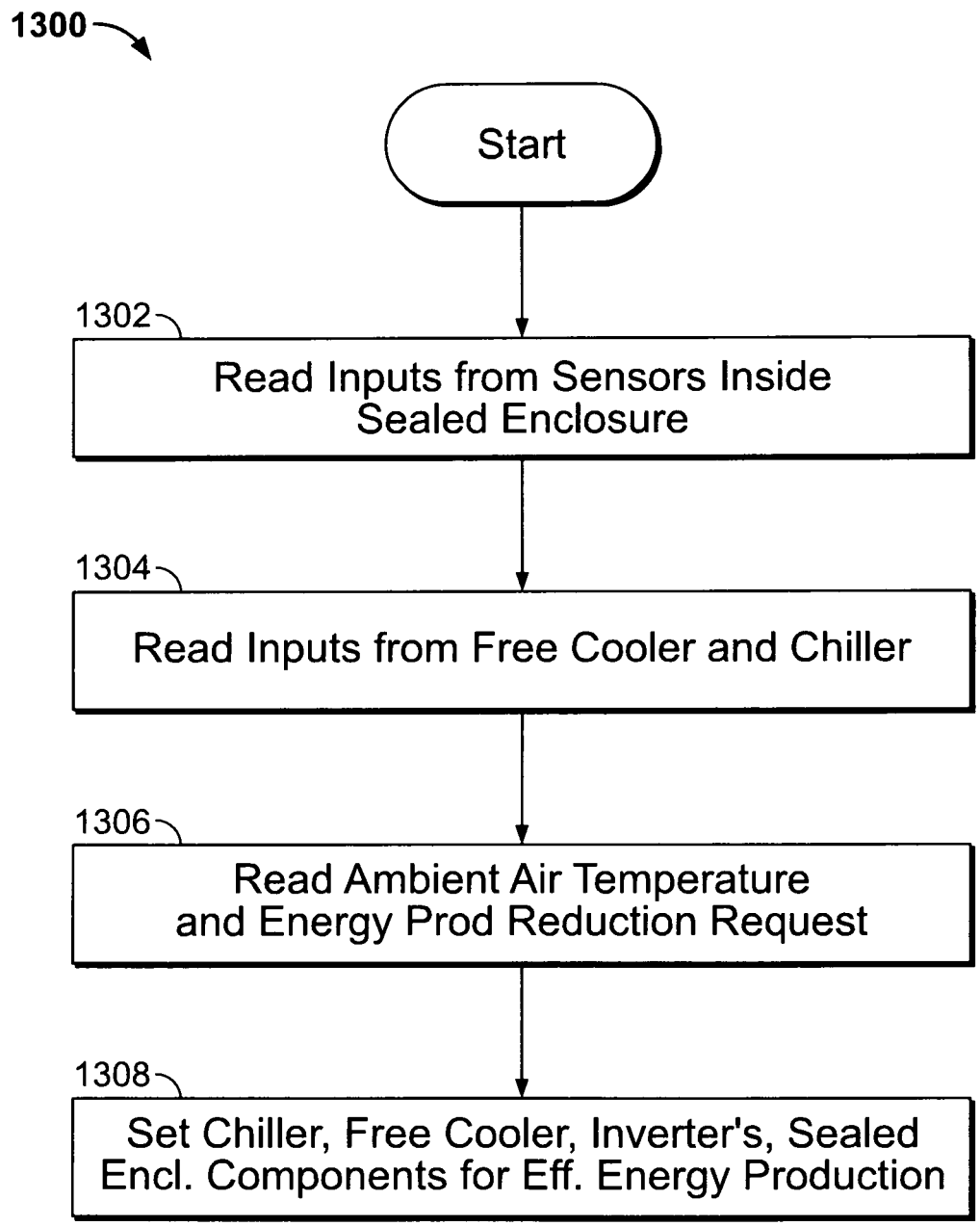
FIG. 13 is a plan view that depicts a control loop for a particular illustrative embodiment of the invention.

FIG. 13 depicts a control loop 1300 for a particular illustrative embodiment of the invention. As shown in FIG. 13, the chiller controller processor reads 1302 inputs from various sensors inside the sealed enclosure, the chiller, the free cooler 1304 and outside temperature to determine how to set the system for efficiently producing electricity. The chiller processor controls reads energy production reduction requests 1306. The chiller controller senses the operation of the system and ambient temperature and adjusts the electrical components inside the sealed enclosure along with the chiller and free cooler to reduce electrical energy consumption needed to run the fans, chiller and increase net electrical energy produced 1308.

Figure 14:
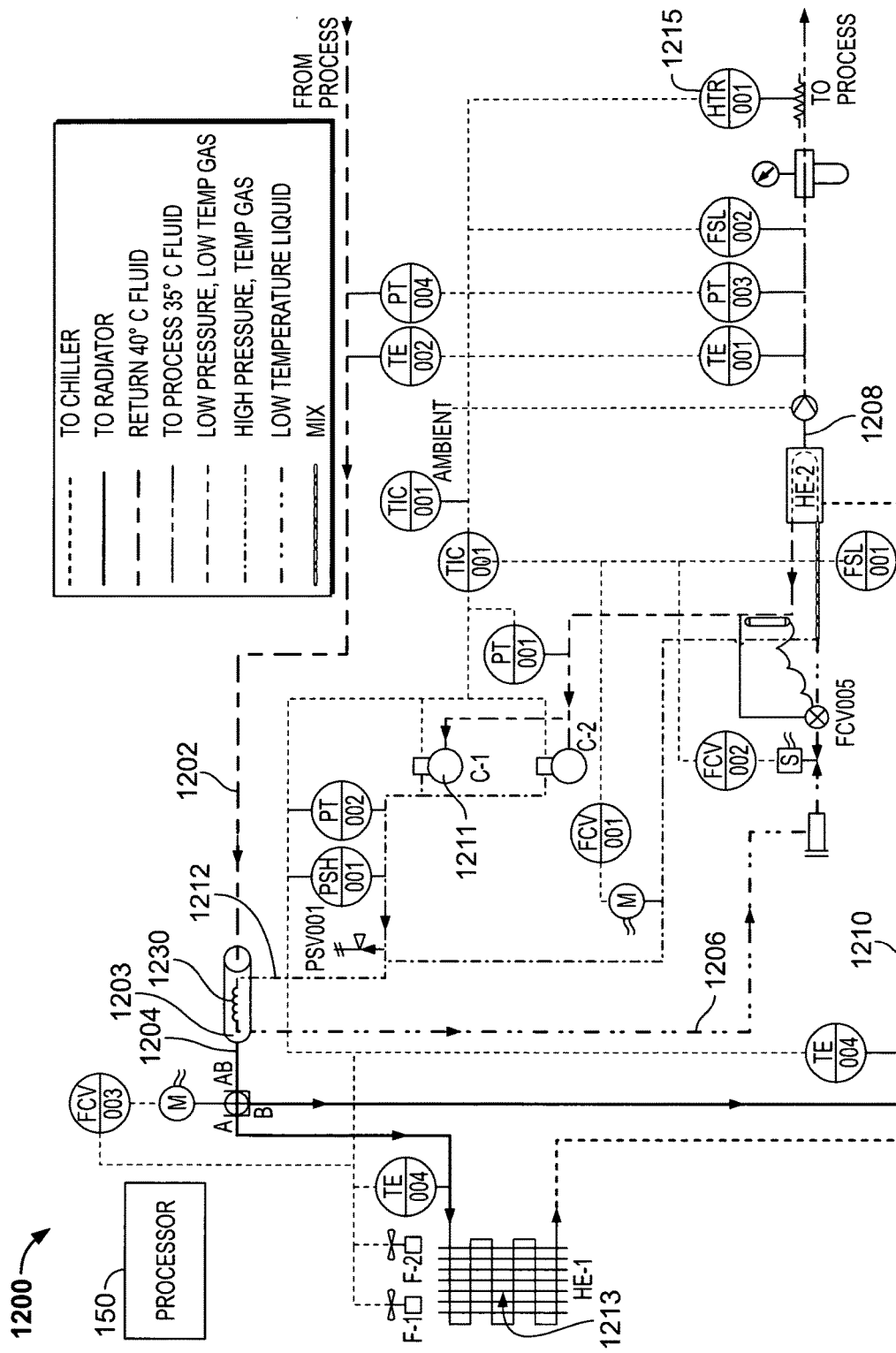
FIGS. 14-17 are plan views that depicts another embodiment of the invention having a Freon to water heat exchanger and a water to air heat exchanger.

Turning now to FIG. 14, in another particular embodiment, water 1202 from the process (drive) is returned from the process via Freon to water heat exchanger 1203. Freon loop 1230 passes through the Freon to water heat exchanger. Hot high temperature gases 1212 flow from the compressor 1211 through the Freon to water heat exchanger Freon loop 1230. Low temperature Freon fluid 1206 returns to the compressor from the Freon to water heat exchanger. Heat from the Freon is transferred to the water in the Freon to water heat exchanger 1203. The water 1204 from the Freon to water heat exchanger passes through the air to water heat exchanger 1213 where heat is removed from the water. If the water temperature is too low so as to risk condensation inside the process drive, the processor 150 turns on heater 125 to heat the water before it returns to the process (drive).

Figure 15:
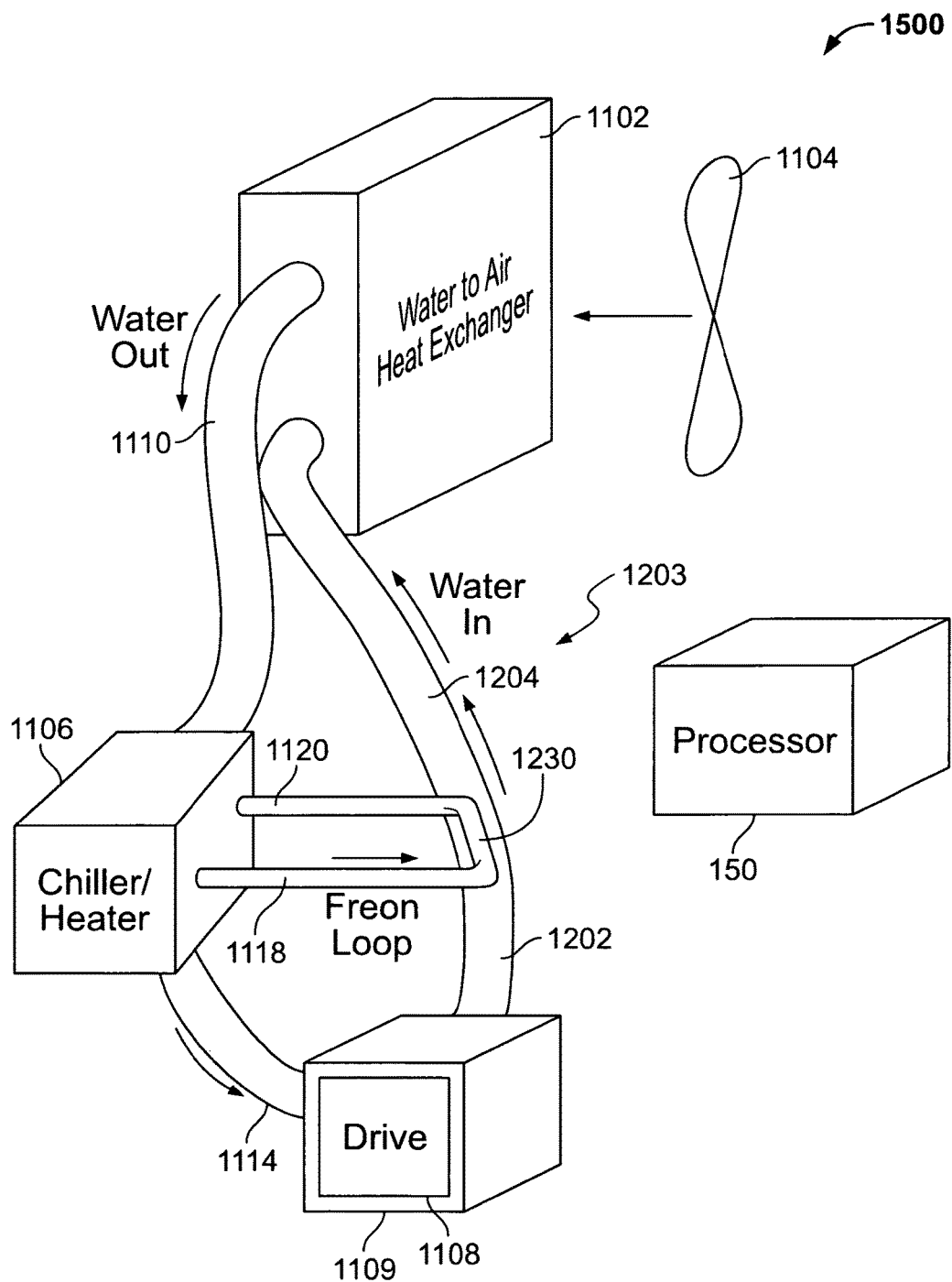

Turning now to FIG. 15, in another illustrative embodiment 1500, as depicted in FIG. 15, water 1110 is routed from a water to air cooler 1102 to chiller/heater 1106. Processor 150 determines a speed for fan 1104 to adjust the amount of cooling performed by water to air cooler 1102. The processor 150 determines whether the water 1110 from the water to air heat exchanger will be chilled or heated before being routed as water 1114 to the drive. The water 1114 from the chiller/heater to the drive 1108 must be cool enough to keep the drive 1108 within its operating but not so cold that it risks causing condensation in the drive 1108 or a drive housing 1109 within which the drive is contained. As shown in FIG. 15, a Freon loop from the heater chiller 1106 sends hot Freon gases 1118 from a compressor in the chiller heater to a Freon to water heat exchanger 1203 wherein a portion of the Freon loop 1230 is immersed in water 1202 returning to the air to water heat exchanger 1102 from the drive 1108. Heat from the portion of the Freon loop 1230 is exchanged with the water 1202. Water is heated by the compressed Freon in the Freon loop 1118, 1230, 1120 and drive heat from drive 1108. The water 1204 which has been heated by the Freon loop portion 1230 and the drive 1108 is cooled in the water to air heat exchanger 1102. In a particular embodiment a temperature difference of 5 degrees centigrade is generated by the drive heating input water 1114 by 5 degrees centigrade so that output water 1202 from the drive is 5 degrees centigrade hotter than input water 1114. In another embodiment the Freon loop 1230 heats the water 1202 returning from the drive 1108 by another 5 degrees centigrade.

Figure 16:
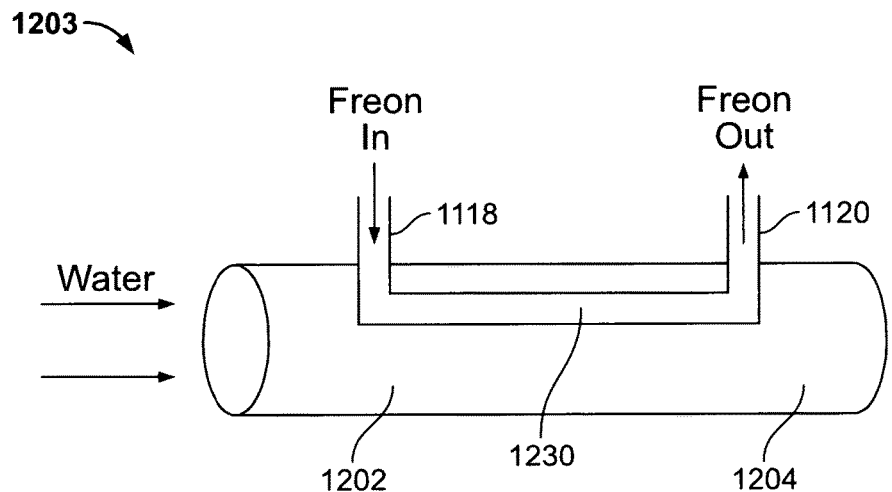
Figure 17:
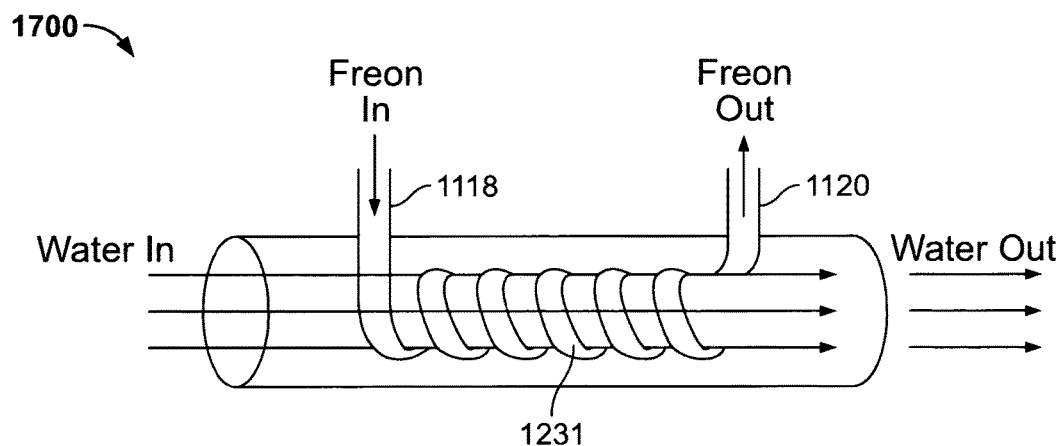

Turning now to FIG. 16, a side view of the Freon loop 1203 is shown. In the embodiment shown in FIG. 16, the Freon loop is a 2 inch pipe placed so that a portion 1230 of the 2 inch pipe is routed through the pipe carrying water 1202 from drive 1108. Turning now to FIG. 17, in another embodiment the portion of the Freon loop routed through the pipe carrying water 1202 from the drive 1108 is a coiled tube 1231 which enhances heat exchange between the Freon and water in the Freon to water heat exchanger.

In particular embodiment, the chiller controller processor reads the shutdown voltage from the day before, that is, the voltage when the sun goes down and sets the startup voltage for the system at the shutdown voltage plus 10%. The shutdown voltage is the voltage at which the system quits producing more energy that it uses to run the chiller, inverters, free cooler fans and entire system used to produce electrical energy. The chiller controller process then reads the voltage produced by the solar cell array and turns the system on when the voltage produced by the solar cell array exceeds the startup voltage. In a particular embodiment, the chiller controller processor reads the ambient air temperature, the inverter temperature, the coolant temperature going into the sealed enclosure and the temperature of the coolant coming out of the sealed enclosure, the temperature of the air inside the sealed enclosure, the humidity inside the sealed enclosure and the dew point inside the sealed enclosure and sets the system to produces electricity with a reduced electrical energy used and an increased net electrical energy produced.

In a particular embodiment the chiller processor controller modulates hot gases from the chiller condenser to heat coolant when the coolant entering the sealed enclosure can cause condensation of water from the air inside the sealed enclosure, thereby reducing the chance of electrical short circuit of the electrical components inside the sealed enclosure. In a particular embodiment, the chiller controller processor stages the two chiller compressors based on the heat load place on the chiller. If the load required to keep the process running below maximum operating temperature is less than the capacity for the first one of the compressors, only the first one of the chiller compressors is turned on and used. Once the heat load increases to a particular percentage of the first chiller compressor's capacity the second one of the two chiller compressor is turned on and used. Once both compressor are turned on the chiller controller processor shares the load between the two chiller compressors. In another particular embodiment the neural network in the chiller controller processor sets the load on the two compressors to reduce the amount of energy used to produce energy without uses excess electrical energy to produce energy from the solar array for the current level of electrical energy produced by the solar array feeding into the sealed enclosure at the currently measure ambient temperature, coolant in and out temperature and energy production desired from the solar array while avoiding cycling one or both of the compressors off and on due to fluctuations in the amount of energy being produced by the solar cell array 500. The compressor fan speeds and the compressors are controlled for reduced energy usage for current level of electrical energy produced by the solar array feeding into the sealed enclosure at the currently measure ambient temperature, coolant in and out temperature and energy production desired from the solar array while avoiding cycling one or both of the compressors off and on due to fluctuations in the amount of energy being produced by the solar cell array 500.

The chiller controller processor uses the air conditioner in the sealed enclosure is used to heat or cool the air inside of the sealed enclosure to avoid condensation of water from the air inside of the sealed enclosure for a given temperature, humidity and dew point. The chiller controller processor monitors the temperature inside of the sealed enclosure, the ambient temperature, the load for the inverters from the voltage produced by the solar cell array 500, the temperature on the inverters from sensor "t" 411, and uses the AC inside the sealed enclosure to cool the air in the sealed enclosure to prevent inverter overheating when the air is too warm and to warm the air inside the sealed enclosure to prevent condensation when the air is too cool. In another particular embodiment the neural network controls the AC inside the sealed enclosure based on historical data for the sealed enclosure to achieve an efficient net energy production from the system.

In a particular embodiment the chiller controller processor controls the fan speeds for the two chiller fans for the free cooler for an efficient net energy production from the system. In a particular embodiment, a variable speed fans are provided on the compressors and the chiller controller processor varies the speed of the fans on the compressor to control the temperature of the compressor gas entering and leaving the compressor to achieve a consistent discharge pressure from the compressor. In another embodiment the input and output pressure for the compressor is monitored by the chiller controller processor to detect problems such as a clogged filter or a leak when a difference between a pressure of gas coming into the compressor and a pressure of gas leaving the compressor exceed a predetermined alarm threshold. In another particular embodiment, the compressor fan speeds are controlled by the neural network based on the incoming and discharge pressure for the compressor.

In another particular embodiment, the chiller controller processor senses the process temperature supply at sensor TE4, the ambient temperature at TE3 and adjusts the FCB4 free cooler mod valve to adjust the return temperature of coolant to the process to achieve efficient energy production by controlling the free cooler fan speeds.

When the ambient temperature is too high, that is, the temperature of the inverters is above the maximum operating temperature, the chiller controller processor sends a currently limiting command to the inverters to de-rate the inverters to a lower output to allow the inverters to keep operating at a lower capacity. In a particular embodiment the current limiting commands are sent to the inverters in the sealed enclosure from the master controller or the user interface from a remote location.

In another particular embodiment, an energy reduction request is produced by a utility company to reduce excess power produced by the system and supplied to the grid by the system. In particular embodiment, the chiller controller processor request a 20% reduction in power produced. The chiller controller processor sends a currently limiting command to the inverters and adjusts the chiller and free cooler to produce net energy efficiently at the reduced power production level. In another embodiment, the neural network adjusts the chiller and free cooler to produce net energy efficiently at the reduced power production level based on historical data for the system.

In a particular embodiment, the 3 inverters are staged for efficient net energy production so that only one inverters is turned on to until the voltage produced from the solar cell array approaches the capacity of the one inverter is used and then a second inverter is turned on. Once the second inverter is turned on and the load from the solar cell array is shared between the first and second inverters at a rate historical shown to produce a substantially maximized net energy production for the given voltage produced by the solar cell array. When the two inverter capacity is used by the solar cell array a third solar cell array is turned on and the load is shared between the three inverters to efficiently produce a net energy production with substantially the least amount of power used to produce the energy.

In a particular embodiment, the solar cells are rated to produce more energy than the inverter can handle, so that at peak hours of the day, when the solar cells are producing the most energy, the chiller processor controller limits the amount of power produced by the inverters so that one inverter may run at 100% and another one run at 40%. Limiting the production of the inverters in performed to avoid turning the inverters on and off and using more energy than it would take to limit the inverters to produce the energy. In a particular embodiment a neural network uses historical data, learned from monitoring the system inputs and net energy produced. Thus, in a particular embodiment, when the ambient air temperature is too hot to run the inverters at full capacity, the chiller controller processor will de-rate the inverters to reduce the amount of energy produce, for example by 25%, to allow the inverters to continue running at a temperature higher than their full maximum output level operating temperature. In another embodiment, the neural network uses historical data learned from the system to adjust the inverters, condensers and free cooler to use the least amount of energy to produce the most net energy for a given combination of ambient temperature and desired net energy production.

In a particular embodiment, the chiller processor will de-rate the inverters and run the inverters at a higher temperature so that the on the free cooler is used and the chiller is not needed to produce a given amount of net energy production for a given ambient temperature and coolant temperature for a given voltage supplied by the solar cell array. In another embodiment, the variable speed fan blades pitch is altered by the chiller controller processor to control the amount of and speed of cooling air provided by the compressor and cooler fans. In another embodiment, flow of the process coolant is regulated by the chiller processor for net energy production efficiency.

In another embodiment, historical and current actual cloud over and meteorological data are used by the neural network to control the net energy production by adjusting the system based on past learned settings observed by the neural network. The meteorological data includes but is not limited to current cloud cover, rain, wind speed and ambient humidity.

In a particular embodiment, the hybrid cooling system includes but is not limited to the following Major Components: Copeland scroll compressors, Belimo 3-way valves, Krack/Hussman free cooler with copper tubes, aluminum fins and galvanized frame, Heatcraft all aluminum condenser coils, ABB main disconnect, Allen-Bradley 190E Series, OAO fan motors suitable for outdoor duty with ABB VFD for control, Multi-wing fan with aluminum fan hub and glass reinforced polypropylene blades, Ebara, Scot or equivalent TEFC pumps, SWEP or equivalent stainless/copper brazed plate chilled water evaporator, Cara programmable controls, Stainless steel reservoir (closed, vented to atmosphere), Keystone plastic bowl-style full flow bag filters, Copper refrigerant piping, Water circuit of brass, bronze, plastic, PVC and hose, Sporlan or equivalent refrigeration components, Galvanized modular frame with powder coated panels and NEMA-4 control/power enclosures and a chiller processor controller.

In another particular embodiment, the following are provided: a Water cooled variable speed drive. The maximum cooling inlet water temperature is 37° C., for condensation concerns, thus the chiller processor substantially stabilizes the cooling water temperature at 35° C., +/−2° C. max. If the cooling water temperature is too cold, it could cause condensation on the pipes causing short-circuits if the condensed water on the pipes drips into electronic and electrical circuitry. In a particular embodiment, the drive maintains maximum efficiency up to ambient temperatures of 50° C. at the site. A particular illustrative embodiment of the invention provides a simple air/water radiator, with a forced air fan blowing air through the radiator to water cool the drive. It's expected that the air/water radiator cooling will be efficient for most of the year. For approximately 2 months out of the year, the process site location will experience very hot days. On these days, the air to water radiator would act as a heater, not a cooler. So we need to shut this system off, and during these times use a chiller system to cool the drive. The water-to-air fluid cooler will be used when ambient temperatures are 33° C. or below, to provide a large enough delta temperature to keep the drive temperature below 41° C. maximum process operating temperature. The inverter lineup will packaged in a NEMA 4 rated enclosure outdoors, and the chiller/fluid cooler will be packaged by EPD in a NEMA 3 enclosure, isolated from the electrical components.

In a particular illustrative embodiment, the Liquid Cooled Components Specifications as provided are Qty (3) 415 KW Drives, Qty (9) Reactors. System Heat Losses are Losses to liquid: Per Drive: 9.2 kW, 3 drives*9.2 kW=27.6 kW, Per Reactor: 480 Watts, 9*480 W=4.32 kW. Water-to-Air AC units, 5 kW, Total: 37.92 kW losses to liquid—40 kW total. Losses to air are Per Drive: 600 W, 3 drives*600 W=1.8 kW, Per Reactor: 110 Watts, 9 reactors*110 W=990 Watts. Total: 2.79 kW losses to air—3 kW total. Flow rate specifications are Per Drive: 35 l/minute (minimum flow per drive: 20 l/min), 3*35l=105 l/min, Per filter: 10 l/minute, 9*10l=90 1 l/min, Total Flow rate=195 l/min. Estimated flow for AC units=25 l/min, 240 l/min total flow provided. In a particular embodiment a Pressure Drop: Across each drive is 1.5 bar@35 l/min, Across each reactor: 0.4 bar@8l/min. In a particular embodiment, a Glycol/water solution is provided, 20% solution of inhibited propylene glycol mixture, i.e., Dowfrost (or equivalent). In a particular embodiment, the Water Circuit is made of a Standard non-ferrous components (plastic, stainless, copper, brass and bronze). For electrochemical corrosion an inhibitor such as Ferrolix 332/Henkel, or VpCl-649 needs to be added to the cooling medium prior to use.

In a particular embodiment, the Environmental Conditions are for an Inland location with an elevation of ~1,300 M (4,265 ft.). A minimum expected ambient temp −5° C. or 23° F. with a maximum expected ambient temp of 50° C. or 122° F.

In a particular embodiment, the hybrid cooling system is provided having 40 KW with MODBUS control protocol and using two compressors in lieu of one. In a particular embodiment, the Heat load is 40 kW (11.4 tons), Flow to be approximately 64 GPM (240 LPM), Pressure to be approximately 40 PSI (maximum pressure no more than 6 bar), 100 micron side-stream filter on recirculation circuit. In a particular embodiment an installation location is to be outdoors in Mexico at 4,300 ft. elevation. The chiller design is to be air cooled. The ambient temperature range is 23° F.-122° F. The chiller is to be constructed with nonferrous water side components. The design coolant supply set point is 35° C. (95° F.). The coolant to be 20% propylene glycol solution. The water circuit construction to be stainless, copper, brass, bronze, plastic, PVC. The install location is non-hazardous and does not have elevated levels of sulphur. The chiller frame is standard galvanized and cabinetry is powder coated.

The free cooler cabinet is primarily galvanized, with conduit and wiring to be suitable for outdoor duty, power is 460V/3/60 and the system to include free cooling (direct air to water cooler to function when ambient temperatures are at 90° F. or below).

In an illustrative embodiment, the refrigeration circuit runs at a maximum of 80° F. water temperature. Since the project requirement is for 95° F., a tempering loop is provided inside of the chiller consisting of a 2nd pump and 3-way control valve to temper the process water to 95° F. The free cooler will operate to provide cooling for the system as long as the ambient temperature is 90° F. or below. Above 90°, the chiller will operate to maintain the process temperature no higher than 95° F. (35° C.). The fluid will be diverted to the cooler by a 3-way valve contained in the chiller.

Communications between the chiller and chiller controller processor are in the form of discrete and analog signals (total number of signals to be determined) or MODBUS. Future development of PROFIBUS communication protocol expected. The chiller and fluid cooler have separate main power drops. A Model AC2A10-ODHTFC Air Cooled Chiller package rated for 11.4 tons of cooling capacity with 122° F. ambient air temperature. Includes MODBUS and two compressors. A Model EC-11 Water-Air Fluid Cooler rated for 11.4 tons of cooling capacity with 90° F. ambient air temperature is provided. The package has a power panel requiring a power drop with control wiring run from the chiller. The cooler integrates into the system as suggested in FIG. 1 and FIG. 2.

Efficient microchannel condensers provide full rated capacity with high ambient conditions. These chillers are provided with microchannel condensers. Microchannel condensers exhibit numerous advantages over the traditional tube and fin condensers. Microchannel condensers are more efficient and allow for less refrigerant charge to be used which makes Microchannel condensers the "green", energy efficient solution. The design is inherently more durable and efficient since the fins have a metallurgical bond to the tubes and they are all aluminum thereby eliminating the potential corrosion concerns associated with copper tubes.

In a particular embodiment, HFC-410A (Puron) refrigerant is provided which meets Montreal Protocol requirements. HFC-410A is the refrigerant of choice to replace HCFC-22, which was phased out for new equipment at the end of 2009. It is the most common refrigerant in the country, which makes it easier to support with local service technicians. HFC-410A is more environmentally friendly and more energy efficient than HCFC-22 or HFC-407c. HFC-410A is an azeotropic blend, so it can be recharged without the challenges associated with the zeotrpoic blends such as HFC-407c.

In a particular embodiment, the chiller controller processor is a programmable microprocessor provided for high reliability and tight temperature control. The programmable microprocessor controller provides expandable functionality and tight temperature control. The chiller controller processor has UL, CSA, and CE certifications, so it can be marketed everywhere and meet the local codes. This microprocessor accepts thermistor temperature sensors, so it can provide accurate temperature control based upon accurate inputs. This will greatly reduce the chance of freeze-ups that can be caused by out-of-tolerance temperature sensing or erratic temperature control.

In a particular embodiment, as shown in FIG. 2, a Remote Microprocessor Display provides convenient monitoring of chiller. As standard, the microprocessor display is provided with a magnetic backing and a 20 foot cable (longer cables available). This allows the operator to monitor the chiller operation from a convenient location. This is a particularly important feature if the chiller is going to be located up on a mezzanine above the laser system.

In a particular embodiment, chiller controller controls modulating of hot gas bypass and staging of compressors which provides temperature and capacity control with low loads. Based upon the number of machines operating and several other factors, the heat load placed on the chiller can vary greatly from full load to almost no load. It is a challenge to maintain temperature across this wide range. The combination of the modulating hot gas bypass valve along with compressor unloading enables the chiller processor to provide tight control down to no load without cycling the compressor. Unloading of a compressor at lower loads also saves significant energy.

In a particular embodiment the chiller processor provides for variable frequency drive (VFD) Controlled Fans provide stable head pressure, which results in tighter temperature control and greater reliability. Varying the speed of the condenser fan motors provides for a substantially more consistent refrigerant discharge pressure for the compressors. Varying the speed of the condenser fan motors results in better temperature control even with variable process loads and ambient conditions. The VFD control extends the life expectancy for the fan motors, and the more consistent refrigerant discharge pressure can also extend the life expectancy for the compressors. Running the fans at a slower speed also reduces the energy consumption.

In a particular illustrative embodiment, the chiller processer provides enhanced diagnostic capability facilitates field troubleshooting and reduces downtime as shown in FIG. 3. Process Water Pressure, Refrigerant Suction Pressure, and Refrigerant Discharge Pressure are provided on digital displays on the chiller processor microprocessor. These digital displays make start-ups go smoother since the technicians will have more information to work with. It will also make field troubleshooting easier, which will significantly reduce downtime when an issue does arise.

In a particular illustrative embodiment, the Chiller is designed to meet NFPA-70 (NEC Code) and NFPA-79 with UL/C-UL certified panel. Many customers are now demanding that equipment meets these codes. In certain areas of the country, these codes are required by law.

In another particular embodiment, a Chiller Maintenance Required Alarm provides early warning indicating that preventive maintenance on the hybrid cooling system should be scheduled. The chiller processor control system on the chiller is designed to provide an advance warning whenever possible that the chiller will be having a potential problem in the near future. It does this by monitoring several of the critical parameters and sending out a warning signal if one of these parameters strays outside of the normal operating range. This allows the operator to schedule the maintenance when it is more convenient and possibly avert a more expensive failure mode.

In a particular embodiment, a Scroll compressor is provided for improved reliability and energy efficiency along with generously sized microchannel condenser for industrial environments. Also provided are a top discharge fan and cleanable condenser air inlet filter, Brazed plate evaporator provides higher efficiencies due to reduced fouling, low ambient controls to 23° F., electronic modulating hot gas bypass for capacity control, TEFC pumps and nonferrous water circuit construction, Free cooling and tempered circuit 3-way valves with controls, 100 micron side-stream filter on evaporator recirculation and insulation on reservoir and chilled water piping. The system is factory tested under partial and full load conditions.

The hybrid cooling system is provided within a NEMA-4 electrical enclosure with rotary non-fused disconnect and outdoor duty wiring with Free cooling system controls, NFPA-70 and NFPA-79 electrical specifications and UL508A certified control panel, PID control algorithm with load shedding, Remote magnetic display panel 8×22 LCD display (can be mounted in a window kit if desired), alarm history screen provides critical information for troubleshooting and a remote chiller enable and alarm indication.

Digital displays are provide for Set Temperature, Pump Discharge pressure, Refrigerant Suction pressure, Leaving temperature, Reservoir Level, Refrigerant discharge pressure, entering temperature, processor flow and compressor run time. Alarm Faults and Warnings are provided for the Water Circuit as follows: High Leaving Temp Fault, Low Water Level Warning, Low Leaving Temp Fault, Low Water Level Fault, Sensor Failure Fault, High Water Level Fault, Low Evaporator Flow Fault, Pump Motor Overload, Low Flow Warning and Low Flow Fault. Alarm Faults and Warnings are provided for the Refrigeration Circuit as follows: Suction Pressure Warning, Suction Pressure Fault, Discharge Pressure Warning, Discharge Pressure Fault and Compressor Motor Overload.

In a particular illustrative embodiment, galvanized steel structural members are provided with heavy gauge aluminum cabinet panels, Corrugated aluminum fins with staggered copper tubes for optimum heat transfer, PVC-coated steel fan guards for optimum corrosion protection, Fully baffled fan sections to prevent reverse rotation, Aluminum fan blades statically and dynamically balanced, Energy efficient fan motors with direct-drive fans, Weatherproof electrical enclosure with single-point field wiring and a UL listed control panel.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present invention, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present invention contemplates a machine readable medium containing instructions, or that which receives and executes instructions from a propagated signal so that a device connected to a network environment can send or receive voice, video or data, and to communicate over the network using the instructions. The instructions may further be transmitted or received over a network via the network interface device. The machine readable medium may also contain a data structure for containing data useful in providing a functional relationship between the data and a machine or computer in an illustrative embodiment of the disclosed system and method.

While the machine-readable medium is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the invention is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the invention is not limited to such standards and protocols. Each of the standards represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived there from, such that structural and logical substitutions and changes may be made without departing from the scope of this disclosure. Figures are also merely representational and may not be drawn to scale. Certain proportions thereof may be exaggerated, while others may be minimized Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A system comprising:
   a drive inside of a drive housing;
   a water to air heat exchanger the proved water to the drive;
   a chiller heater that receives the water from the water to air heat exchanger through a first conduit;
   a second section of conduit that routes the water from the chiller heater to the drive;
   a third section of conduit that routes the water from the drive to the water heat exchanger; and
   a freon loop that sends hot freon gases from a compressor in the chiller heater through the water from the drive wherein the heat from the freon loop heats the water from the drive.

2. A method comprising:
   circulating water though a drive inside of a drive housing;
   providing water to the drive from a water to air heat exchanger;
   receiving the water at a chiller heater from the water to air heat exchanger through a first conduit;
   routing the water from the chiller heater to the drive through a second section of conduit that routes;
   routing the water from the drive to the water heat exchanger through a third section of conduit; and
   sending hot freon gases from a compressor in the chiller heater though a freon loop that runs through the water from the drive wherein the heat from the freon loop heats the water from the drive.

* * * * *